(12) United States Patent
Honda et al.

(10) Patent No.: US 8,119,545 B2
(45) Date of Patent: Feb. 21, 2012

(54) FORMING A SILICON NITRIDE FILM BY PLASMA CVD

(75) Inventors: Minoru Honda, Amagasaki (JP); Toshio Nakanishi, Amagasaki (JP); Masayuki Kohno, Amagasaki (JP); Tatsuo Nishita, Amagasaki (JP); Junya Miyahara, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/935,138

(22) PCT Filed: Mar. 30, 2009

(86) PCT No.: PCT/JP2009/057006
§ 371 (c)(1),
(2), (4) Date: Dec. 16, 2010

(87) PCT Pub. No.: WO2009/123325
PCT Pub. Date: Oct. 8, 2009

(65) Prior Publication Data
US 2011/0086517 A1    Apr. 14, 2011

(30) Foreign Application Priority Data

Mar. 31, 2008    (JP) .................. 2008-092418
Mar. 31, 2008    (JP) .................. 2008-092419
Mar. 27, 2009    (JP) .................. 2009-079530

(51) Int. Cl.
*H01L 21/31*    (2006.01)
*C23C 16/00*    (2006.01)

(52) U.S. Cl. ................ 438/792; 438/793; 257/E21.293; 118/723 AN

(58) Field of Classification Search .................. 438/792, 438/793; 118/723 AN; 257/E21.293
See application file for complete search history.

(56) References Cited

U.S. PATENT DOCUMENTS 5,053,832 A * 10/1991 Uchida ...................... 257/4
5,582,880 A    12/1996 Mochizuki et al.
(Continued)

FOREIGN PATENT DOCUMENTS
EP    0562623 A2    9/1993
(Continued)

OTHER PUBLICATIONS

International Search Report for International Application No. PCT/JP2009/057006 mailed Jun. 16, 2009 with English translation.

*Primary Examiner* — Kevin Parendo
(74) *Attorney, Agent, or Firm* — Harry K. Ahn; Abelman Frayne & Schwab

(57) ABSTRACT

Provided is a plasma CVD device. In the plasma CVD device, in producing a silicon nitride film while controlling the size of a band gap by CVD, microwaves are introduced into a treatment vessel by a flat antenna having a plurality of holes. The plasma CVD is carried out under a given treatment pressure selected from a pressure range of not less than 0.1 Pa and not more than 1333 Pa at a flow ratio between a silicon-containing compound gas and a nitrogen gas (silicon-containing compound gas flow rate/nitrogen gas flow rate) selected from a range of not less than 0.005 and not more than 0.2, whereby the Si/N ratio in the film is controlled to form a silicon nitride film having a band gap size of not less than 2.5 eV and not more than 7 eV.

7 Claims, 11 Drawing Sheets

U.S. PATENT DOCUMENTS

| | | | |
|---|---|---|---|
| 6,121,161 A * | 9/2000 | Rossman et al. | 438/783 |
| 6,357,385 B1 | 3/2002 | Ohmi et al. | |
| 6,380,612 B1 * | 4/2002 | Jang et al. | 257/649 |
| 2002/0164883 A1 | 11/2002 | Ohmi et al. | |
| 2005/0208776 A1 * | 9/2005 | Krishnan et al. | 438/770 |
| 2005/0250338 A1 * | 11/2005 | Ohmi et al. | 438/726 |
| 2008/0012065 A1 * | 1/2008 | Kumar | 257/324 |
| 2008/0023750 A1 * | 1/2008 | Xue et al. | 257/321 |

FOREIGN PATENT DOCUMENTS

| | | |
|---|---|---|
| JP | 4-328296 A | 11/1992 |
| JP | 5-145078 A | 6/1993 |
| JP | 5-275346 A | 10/1993 |
| JP | 6-333842 A | 12/1994 |
| JP | 2008-277306 A | 11/2008 |
| WO | 98/33362 A1 | 7/1998 |
| WO | 2007/139142 A1 | 12/2007 |

* cited by examiner

FORMING A SILICON NITRIDE FILM BY PLASMA CVD

This is a U.S. national stage application of International Application No. PCT/JP2009/057006, filed on 30 Mar. 2009. Priority under 35 U.S.C. §119(a) and 35 U.S.C. §365(b) is claimed from Japanese Application No. JP2008-092418, filed 31 Mar. 2008; JP2008-092419, filed 31 Mar. 2008, and JP2009-079530, filed 27 Mar. 2009, the disclosures of which are also incorporated herein by reference.

TECHNICAL FIELD

The present invention relates to a process for producing a silicon nitride film and a silicon nitride film laminate, and also relates to a computer-readable storage medium and a plasma CVD device used for the process.

BACKGROUND

Among the non-volatile semiconductor memory devices represented as an electrically re-writable EEPROM (Electrically Erasable and Programmable ROM), some of them have a laminated structure such as SONOS (Silicon-Oxide-Nitride-Oxide-Silicon) type or MONOS (Metal-Oxide-Nitride-Oxide-Silicon) type. In these types of non-volatile semiconductor memory devices, information is retained by one or more layers of silicon nitride film, formed between silicon dioxide films (oxide), as a charge-accumulating area. That is, in the non-volatile semiconductor memory devices a voltage is applied between a semiconductor substrate (silicon) and a control gate electrode (silicon or metal) to inject electrons into the silicon nitride film of the charge-accumulating area thereby storing data. Or, data may be re-written for storing or erasing by eliminating electrons accumulated in the silicon nitride film. It is believed that a charge-accumulating capacity of the silicon nitride films is relevant to the band gap structure thereof.

As for the technology for forming a silicon nitride films working as a charge-accumulating area of a non-volatile semiconductor memory device, Patent Literature 1 discloses a method for forming a silicon nitride film between a tunnel oxide film and a top oxide film by a depressurized CVD (Chemical Vapor Deposition) method under the condition that raw gas is dichlorosilane ($SiH_2Cl_2$) and ammonia ($NH_3$), and the flow ratio of $SiH_2Cl_2/NH_3$ is equal to or less than $\frac{1}{10}$. However, it is difficult to control the band gap of the respective silicon nitride film only with the process conditions in the film-producing process by the conventional CVD method. In the conventional process, so as to control the band gap size in the silicon nitride film, after forming the silicon nitride film by the CVD method, the components of the film itself need to be changed by, for example, oxidizing the silicon nitride film to make a silicon nitride oxide film. Therefore, so as to change the quality of the silicon nitride film by an oxidization process, a plurality of film forming devices are needed and, as a result, the processing efficiency is decreased. In particular, the processes become more complicated and the processing efficiency is further decreased when the silicon nitride film which functions as a charge-accumulating area is formed as two or more laminating structure (silicon nitride film laminate).

Though the silicon nitride films are usually formed by the plasma CVD method, most of the silicon nitride films produced by the method shows a good quality with dense and less defects to be used as a hard mask or a stopper film in an etching process.

Patent Literature 1: Japanese Unexamined Patent Publication No. Hei 5-145078 (e.g. paragraph [0015] etc.).

SUMMARY

Problems to be Solved by the Invention

The present invention considers the above facts and is configured, as a first goal, to provide a process for producing a silicon nitride film in which the band gap size can readily be controlled by the CVD method, and, as a second goal, to provide a producing method of the silicon nitride film in which the band gap size of the respective silicon nitride film is changed so that the silicon nitride film laminate can readily be produced by the CVD method.

Means to Solve the Problems

The process for producing the silicon nitride film of the present invention utilizes a plasma CVD apparatus that introduces microwave into a treatment vessel by a planar antenna having a plurality of holes, and generates plasma to form a silicon nitride film on an object to be treated by the plasma CVD method. The method includes a CVD process in which either one of nitrogen gas or ammonia gas along with a silicon-containing compound gas are used, and the treatment pressure is set to be constant in the range of 0.1 Pa and 1333 Pa. In particular, when the film forming gas includes nitrogen gas, the flow ratio of the silicon-containing gas to the nitrogen gas (flow rate of silicon-containing gas/flow rate of nitrogen gas) is selected in the range of 0.005 and 0.2. When the film forming gas includes ammonia gas, the flow ratio of silicon-containing compound gas to ammonia gas (flow rate of silicon-containing compound gas/flow rate of ammonia gas) is selected in the range of 0.015 and 0.2. As a result, a silicon nitride film having the band gap size in the range of 2.5 eV and 7 eV is produced by the plasma CVD.

In the producing method of the silicon nitride of the present invention, it is preferable to set the processing pressure to be constant in the range of 0.1 Pa and 4 Pa, or in the range of 40 Pa and 1333 Pa.

In the producing method of the silicon nitride of the present invention, it is preferable to supply high-frequency wave on the object to be treated in the range of 0.01 W/cm² and 0.64 W/cm² of power density.

The process for producing a silicon nitride film laminate of the present invention utilizes a plasma CVD apparatus that introduces microwave into a treatment vessel by a planar antenna having a plurality of holes, and generates plasma to form a silicon nitride film laminate on an object to be treated. The method includes a first CVD process in which either one of nitrogen gas or ammonia gas along with a silicon-containing compound gas are used, and the processing pressure is set to be constant in the range of 0.1 Pa and 1333 Pa. In particular, when the film forming gas includes nitrogen gas, the flow ratio of the silicon-containing gas to the nitrogen gas (flow rate of silicon-containing gas/flow rate of nitrogen gas) is selected in the range between 0.005 and 0.2. When the film forming gas includes ammonia gas, the flow ratio of silicon-containing compound gas to ammonia gas (flow rate of silicon-containing compound gas/flow rate of ammonia gas) is selected in the range of 0.015 and 0.2. As a result, the silicon nitride film having the first band gap size in the range of 2.5 eV and 7 eV is produced by the plasma CVD. The method also includes a second CVD process, prior to or after the first CVD process, in which either one of nitrogen gas or ammonia gas along with a silicon-containing compound gas are used, and the processing pressure is set to be the same as the first CVD process. In particular, when the film forming gas includes nitrogen gas, the flow ratio of the silicon-containing compound gas to the nitrogen gas (flow rate of silicon-containing gas/flow rate of nitrogen gas) is selected to be different from the first CVD process in the range of 0.005 and 0.2. When the film forming gas includes ammonia gas, the flow ratio of silicon-containing compound gas to ammonia gas (flow rate of silicon-containing compound gas/flow rate of ammonia gas) is selected to be different from the first CVD process in the range of 0.015 and 0.2. As a result, a silicon nitride film is formed having the band gap size different from the band gap size of the silicon nitride film produced in the first CVD process. It is preferable to carry out the first CVD process and the second CVD process repeatedly.

The computer-readable storage medium of the present invention is configured to store a control program that, when executed, causes a computer to control a plasma CVD apparatus to form a silicon nitride film on an object to be treated in which microwave is introduced into a treatment vessel by a planar antenna having a plurality of holes, and generates plasma to form a silicon nitride film by the plasma CVD method. The control program includes a CVD process in which either one of nitrogen gas or ammonia gas along with a silicon-containing compound gas are used, and the processing pressure is set to be constant in the range of 0.1 Pa and 1333 Pa. In particular, when the film forming gas includes nitrogen gas, the flow ratio of the silicon-containing gas to the nitrogen gas (flow rate of silicon-containing gas/flow rate of nitrogen gas) is selected in the range of 0.005 and 0.2. When the film forming gas includes ammonia gas, the flow ratio of silicon-containing compound gas to ammonia gas (flow rate of silicon-containing compound gas/flow rate of ammonia gas) is selected in the range of 0.015 and 0.2. As a result, a silicon nitride film having the band gap size in the range of 2.5 eV and 7 eV is produced by the plasma CVD.

A plasma CVD apparatus of the present invention is configured to form a silicon nitride film on an object to be treated by a plasma CVD method. The plasma CVD apparatus includes a treatment vessel accommodating the object to be treated loaded on a mount table, a dielectric member that covers an opening of the treatment vessel, a planar antenna provided outside the dielectric member and having a plurality of holes for introducing microwave into the treatment vessel, a gas supply device supplying the raw gas into the treatment vessel, an exhaust system depressurizing and exhausting inside of the treatment vessel, and a control unit. In particular, the control unit controls the plasma CVD such that either one of nitrogen gas or ammonia gas along with a silicon-containing compound gas are used, and the processing pressure is set to be constant in the range of 0.1 Pa and 1333 Pa. Moreover, when the film forming gas includes nitrogen gas, the flow ratio of the silicon-containing gas to the nitrogen gas (flow rate of silicon-containing gas/flow rate of nitrogen gas) is selected in the range of 0.005 and 0.2. When the film forming gas includes ammonia gas, the flow ratio of silicon-containing compound gas to ammonia gas (flow rate of silicon-containing compound gas/flow rate of ammonia gas) is selected in the range of 0.015 and 0.2. As a result, a silicon nitride film having the band gap size in the range of 2.5 eV and 7 eV is produced by the plasma CVD.

Effects of the Invention

According to the process for producing a silicon nitride film of the present invention, a silicon nitride film having the band gap size in the range of 2.5 eV and 7 eV is readily produced by carrying out a plasma CVD in which either one of nitrogen gas or ammonia gas along with a silicon-containing compound gas are used, and the processing pressure is set to be constant in the range of 0.1 Pa and 1333 Pa. In particular, when the film forming gas includes nitrogen gas, the flow ratio of the silicon-containing gas to the nitrogen gas (flow rate of silicon-containing gas/flow rate of nitrogen gas) is selected in the range of 0.005 and 0.2. When the film forming gas includes ammonia gas, the flow ratio of silicon-containing compound gas to ammonia gas (flow rate of silicon-containing compound gas/flow rate of ammonia gas) is selected in the range of 0.015 and 0.2. In the present invention, the band gap size can readily be controlled by the selection of the flow ratio of the raw gas and processing pressure so that the silicon nitride film laminate having various band gap structures can be produced continuously. As a result, the processing efficiency is excellent.

DETAILED DESCRIPTION OF EMBODIMENTS

First Embodiment

Figure 1:
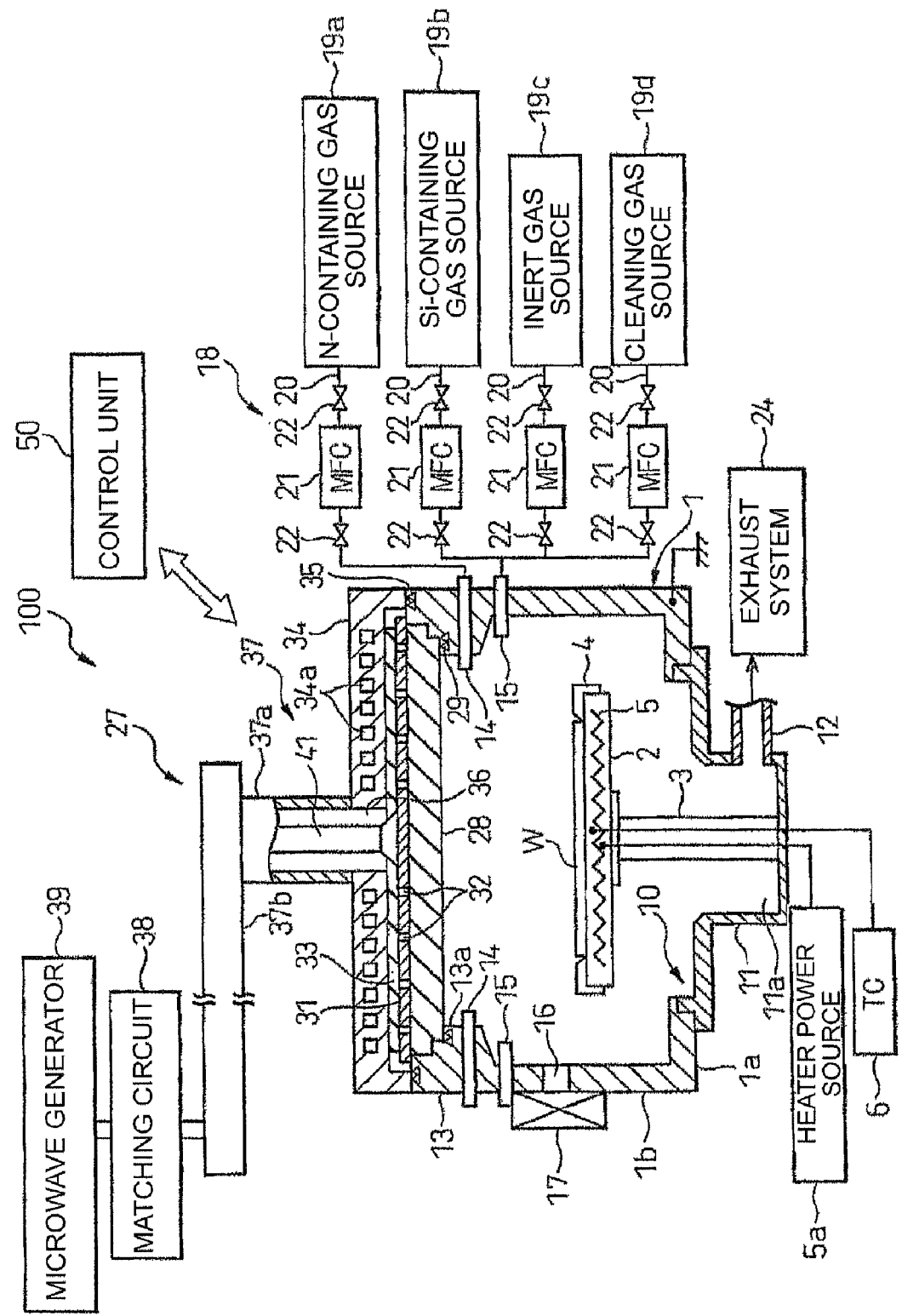
FIG. 1 is a schematic cross sectional view illustrating an example of a plasma CVD apparatus adapted to produce a silicon nitride film.

Hereinafter, exemplary embodiments of the present invention will be described with reference to the drawings. FIG. 1 is a sectional view diagrammatically illustrating a schematic structure of a plasma CVD apparatus 100 applicable to the producing process of a silicon nitride film of the present invention.

Plasma CVD apparatus 100 is constituted with a RLSA (Radial Line Slot Antenna) microwave plasma processing apparatus which can generate microwave excitation plasma of high density and low electron temperature. In particular, plasma CVD apparatus 100 generates plasma by introducing microwave into a treatment vessel with a planar antenna having a plurality of slot-type holes. In plasma CVD apparatus 100, a process with plasma having $1\times10^{10}$ □ $5\times10^{12}/cm^3$ of density and 0.7 □ 2 eV of low electron temperature is possible. Therefore, plasma CVD apparatus 100 can be properly used in manufacturing processes of various semiconductor devices for the purpose of film forming process of the silicon nitride film.

Plasma CVD apparatus 100 includes, as primary components, a treatment vessel 1 configured to be air tight, a gas supply device 18 supplying gas into treatment vessel 1, an exhaust system 24 for depressurizing and exhausting inside treatment vessel 1, a microwave introduce mechanism 27 provided on the top of treatment vessel 1 and introduces microwave into treatment vessel 1, and a control unit 50 that controls each of the components of plasma CVD apparatus 100.

Treatment vessel 1 is formed with an approximately cylindrical vessel which is grounded. Treatment vessel 1 may be formed with a prismatic vessel. Treatment vessel 1 has a bottom wall 1a and a side wall 1b made of, for example, aluminum.

A mount table 2 is provided inside treatment vessel 1 for horizontally supporting a semiconductor wafer W (hereinafter called "wafer") such as a silicon substrate as an object to be treated. Mount table 2 is made of material with high thermal conductivity such as ceramics including AlN. Mount table 2 is supported by a support member 3 having a cylindrical shape and extending from the middle part to the upper part from the bottom portion of an exhaust chamber 11. Support member 3 is made of ceramics such as AlN, for example.

Also, a covering 4 is provided on mount table 2 for guiding the wafer W by covering the outer edge thereof Covering 4 is an annular member made of, for example, quartz, AlN, $Al_2O_3$, and SiN.

Also, a resistive-heating type heater 5 is embedded in mount table 2, as a temperature-adjusting mechanism. Upon being supplied power from a heater power source 5a, heater 5 heats mount table 2, thereby evenly heating the wafer W as an object to be treated.

Also, mount table 2 is equipped with a thermocouple 6 configured to measure and control the wafer temperature, for example, from the room temperature to 900° C.

Also, mount table 2 is equipped with wafer support pins (not shown) configured to support and elevate the wafer W. Each of the wafer support pins is provided on the surface of mount table 2 to be able to protrude.

A circular hole 10 is provided approximately at the middle part of bottom wall 1a of treatment vessel 1. Exhaust chamber 11 is provided on bottom wall 1a protruding downwards and to be communicated with inside of treatment vessel 1. Exhaust chamber 11 is connected with exhaust pipe 12, and connected with exhaust system 24 through exhaust pipe 12.

An opening is provided on the top portion of treatment vessel 1, and a plate 13 is provided at the opening to function as a lid that opens/closes treatment vessel 1. The inner periphery of plate 13 protrudes towards the inside (the inside space of treatment vessel 1), and forms an annular support member 13a.

A gas introduce hole 14 is provided at plate 13 forming an annular shape. Also a gas introduce hole 15 is provided on side wall 1b of treatment vessel 1. That is, gas introduce holes 14, 15 are formed as a two-step of an upper hole and a lower hole. Each of gas introduce holes 14, 15 is connected with a gas supply device 18 that supplies a raw gas for film formation or for plasma excitation. Gas introduce holes 14, 15 may be formed with a nozzle-type or a shower-head type. Also, gas introduce holes 14, 15 may be formed as a single-shower head.

Also, a carry in/out entrance 16 for bringing wafer W in or out, and a gate valve 17 for opening/closing carry in/out entrance 16, are provided between plasma CVD apparatus 100 and a transfer vessel (not illustrated) adjacent plasma CVD apparatus 100, on the side wall 1b of treatment vessel 1.

Gas supply device 18 includes gas supply sources (for example, nitrogen (N)-containing gas supply source 19a, silicon (Si)-containing gas supply source 19b, inert gas supply source 19c, and cleaning gas supply source 19d), pipes (for example, gas lines 20a, 20b, 20c, 20d), flow control devices (for example, mass-flow controllers 21a, 21b, 21c, 21d) and valves (for example, opening/closing valves 22a, 22b, 22c, 22d). Nitrogen-containing gas supply source 19a is connected with gas introduce hole 14 at the upper end portion. Also, silicon-containing gas supply source 19b, inert gas supply source 19c, and cleaning gas supply source 19d are connected with gas introduce hole 15 at the lower end portion. Gas supply device 18 may include another gas supply source not illustrated, such as, for example, a purge gas supply source used for changing the atmosphere in processing chamber 1.

In the present invention, nitrogen gas ($N_2$) can be used as a nitrogen-containing gas of a film-forming raw gas. Also for a silicon-containing compound gas of another film-forming raw gas, for example, silane ($SiH_4$), di-silane ($Si_2H_6$), tri-silane ($Si_3H_8$), TSA (Tri-silyl Amine) can be used. In particular, di-silane ($Si_2H_6$) is preferable. That is, the combination of nitrogen gas and di-silane is preferable as a film-producing raw gas for the purpose of controlling the band gap size in the silicon nitride film. Also, $N_2$ gas or rare gas etc, can be used as inert gas. Rare gas, such as, for example, Ar gas, Kr gas, Xe gas, and He gas can be advantageous for generating stable plasma as a plasma excitation gas. Also, $ClF_3$, $NF_3$, HCl, and F can be exemplified as a cleaning gas.

Nitrogen-containing gas is introduced from nitrogen-containing gas supply source 19a of gas supply device 18 to the gas introduce portion through gas line 20a, and introduced to treatment vessel 1 from gas introduce hole 14. Meanwhile, each of silicon-containing compound gas, inert gas and cleaning gas is introduced from silicon-containing gas supply source 19b, inert gas supply source 19c and cleaning gas supply source 19d to the gas introduce portion through respective gas lines 20b~20d, and introduced to treatment vessel 1 from gas introduce hole 15. Each of gas lines 20a~20d connected to a respective gas supply source is provided with a respective mass-flow controller among mass flow controllers 21a~21d, and each of mass flow controllers 21a~21d is provided with two respective open/close valves among open/close valves 22a~22d disposed at the back and front sides of the respective mass flow controller. By the structure of gas supply device 18, the conversion of supplied gas and the flow rate can be controlled. Rare gas for plasma excitation such as Ar is an arbitrary gas, and needs not to be supplied concurrently with the film-forming raw gas.

Exhaust system 24 includes a vacuum pump (not illustrated) such as a turbo-molecular pump. As previously described, exhaust system 24 is connected with exhaust chamber 11 of treatment vessel 1 through exhaust pipe 12. By operating the vacuum pump, the gas in treatment vessel 1 evenly flows into space 11a of exhaust chamber 11, and also exhausted the outside through exhaust pipe 12 from space 11a. Therefore, inside of treatment vessel 1 can be depressurized with a high-speed to, for example, 0.133 Pa.

Next, the structure of microwave introduce mechanism 27 is described. Microwave introduce mechanism 27 includes, as primary components, a transmission plate 28, a planar antenna 31, a wave retardation member 33, a cover member 34, a waveguide 37 and microwave generator 39.

Transmission plate 28 for permeating microwave is provided on a support member 13a extending from plate 13 towards inner periphery. Transmission plate 28 is made of a dielectric material, for example, ceramics such as quartz, $Al_2cO_3$, and AlN. A sealing member 29 seals air-tight between transmission plate 28 and support member 13a. Therefore, the inside of treatment vessel 1 is kept air-tight.

A disk-shaped planar antenna 31 is provided to be opposite to mount table 2 at the upper side of transmission plate 28. However, planar antenna 31 is not limited to disk-shape, but it can be square-shaped, for example. Planar antenna 31 is fixed at the upper end of plate 13.

Planar antenna 31 is formed with, for example, gold or silver-coated copper plate, nickel plate, SUS plate or aluminum plate. Planar antenna 31 includes a plurality of slot-type microwave radiation holes 32 that radiate microwave. Microwave radiation holes 32 are formed with a predetermined pattern by passing through planar antenna 31.

Figure 2:
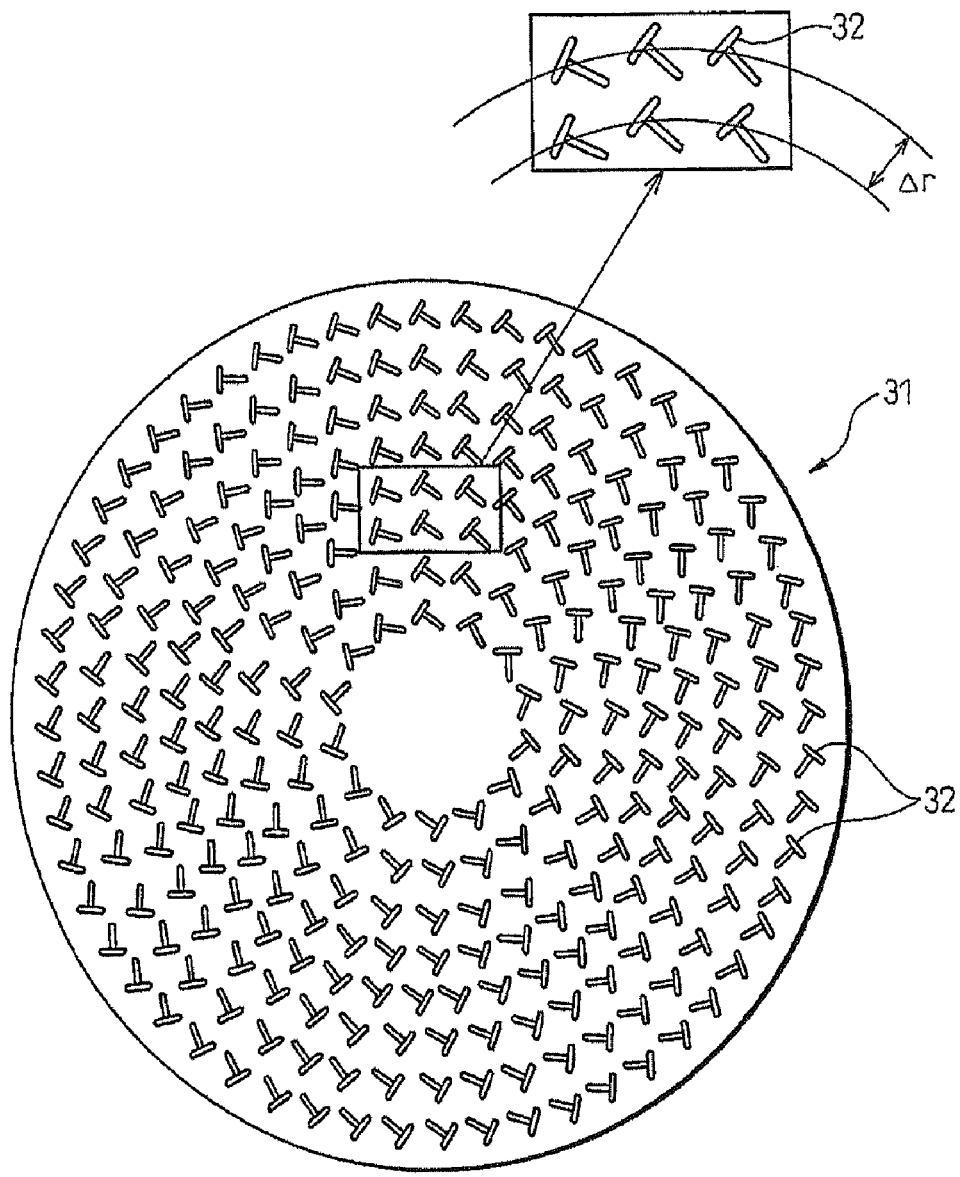
FIG. 2 is a view illustrating the structure of a planar antenna.

Each microwave radiation hole 32, as illustrated in FIG. 2, forms a thin and long rectangle shape, and the two adjacent microwave radiation holes make a pair. And typically, adjacent microwave radiation holes 32 are provided as "T" shape. Also, microwave radiation holes 32 provided collectively in a predetermined shape (e.g. "T" shape) as described above, are arranged as concentric circle shape as a whole. By this arrangement of microwave radiation holes 32, a circular polarized wave can be generated in treatment vessel 1 and plasma can be generated by the circular polarized wave.

The length and arrangement interval of microwave radiation holes 32 are determined by the wavelength λg of microwave. For example, microwave radiation holes 32 are arranged with interval of λg/4 or λg. The interval between adjacent microwave radiation holes 32 provided in the concentric circle shape is represented as Δr in FIG. 2. Microwave radiation hole 32 can have other shape such as circular or circular arc. Also, the arrangement of microwave radiation holes 32 is not limited to concentric circle shape, and may be spiral or radial shape, for example.

Wave retardation member 33 having a larger dielectric constant than vacuum, is provided on planar antenna 31. Wave retardation member 33 allows the wavelength of microwave longer in a vacuum, thereby adjusting the plasma by making the wavelength of microwave short.

Planar antenna 31 and transmission plate 28 can be in contact with each other or can be spaced apart, and wave retardation member 33 and planar antenna 31 can also be in contact with each other or can be spaced apart. However, it is preferable to be in contact with each other.

Cover member 34 is provided at the upper side of treatment vessel 1 to cover planar antenna 31 and wave retardation member 33. Cover member 34 is made of a metal material such as aluminum or stainless steel, etc. Sealing member 35 seals the upper end of plate 13 and cover member 34. A cooling water path 34a is provided inside cover member 34. By flowing the cooling water through cooling water path 34a, cover member 34, wave retardation member 33, planar antenna 31 and transmission plate 28 are cooled and prevented from breaking or deforming. Cover member 34 is grounded.

At the middle part of the upper wall (ceiling part) of cover member 34, an opening 36 is provided, and waveguide 37 is connected with opening 36. Microwave generator 39 generating microwave is connected with the other end of waveguide 37 via a matching circuit 38.

Waveguide 37 includes a coaxial waveguide 37a having a circular cross-section, and extending upwards from opening 36 of cover member 34. Waveguide 37 also includes a rectangular waveguide 37b connected with the upper end of coaxial waveguide 37a and extending horizontally.

At the center of coaxial waveguide 37a, an inner conducting body 41 is extending. Inner conducting body 41 is connected and fixed with the center of planar antenna 31 at the lower end. Coaxial waveguide 37a is formed by communicating with a radial-shaped oblate waveguide formed with cover member 34 and planar antenna 31. By the above structure, microwave can be evenly propagated to planar antenna 31 in a radial direction with a good efficiency via inner conducting body 41 of coaxial waveguide 37a.

By microwave introduce mechanism 27 having the above structures, microwave generated by microwave generator 39 is propagated to planar antenna 31 via waveguide 37 and is also introduced into treatment vessel 1 via transmission plate 28. Microwave frequency is preferably, for example, 2.45 GHz, and can also be 8.35 GHz, 1.98 GHz, etc.

Figure 3:
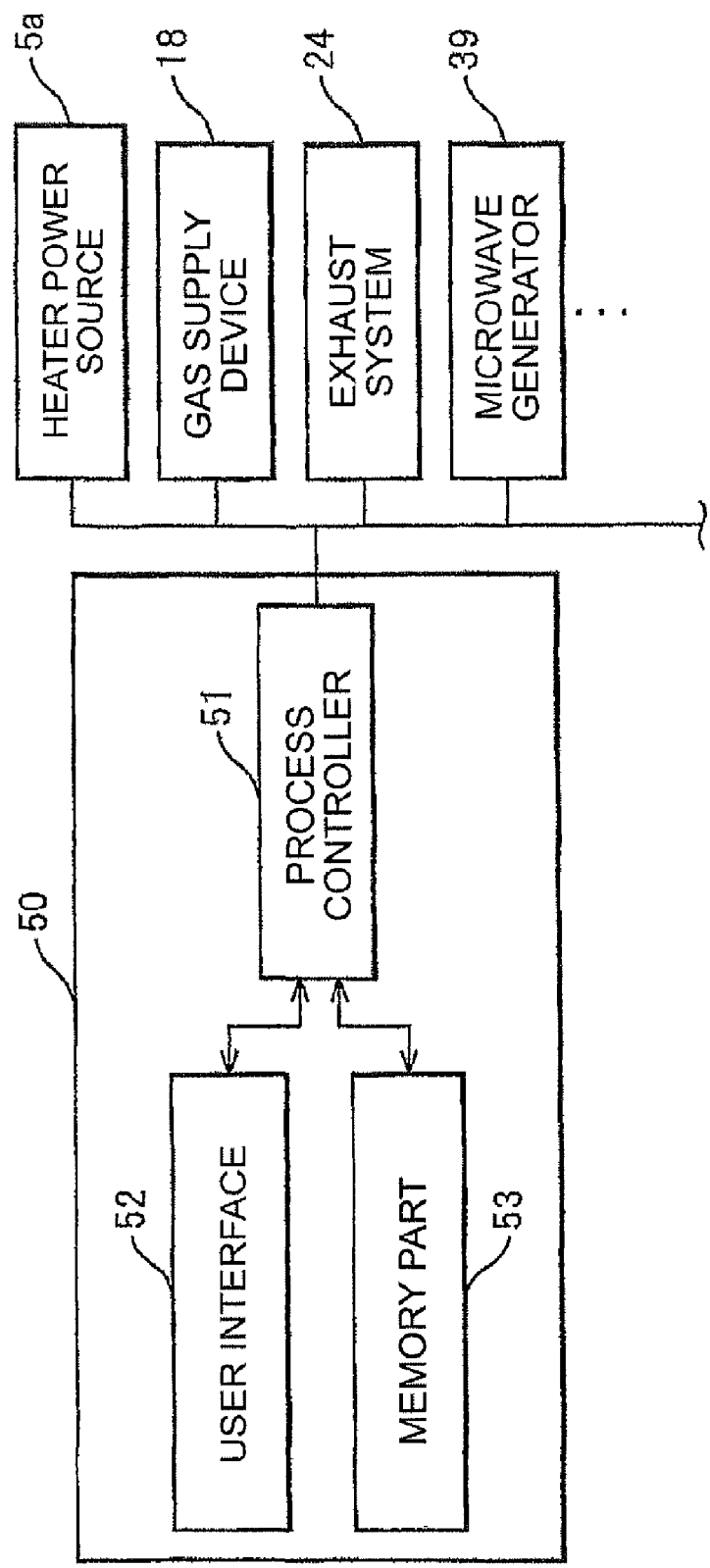
FIG. 3 is an explanatory view illustrating the structure of a control unit.

Each component of plasma CVD apparatus 100 is configured to be connected with a control unit 50 to be controlled. Control unit 50 includes a computer, and also includes a process controller 51 having a CPU, a user interface 52 connected with process controller 51, and a memory part 53, as shown in FIG. 3. Process controller 51 is a control means controlling each component integrally (for example, heater power source 5a, gas supply device 18, exhaust system 24, microwave generator 39 and so on) which relates to processing conditions such as the temperature, pressure, gas flow rate, microwave output, in plasma CVD apparatus 100.

User interface 52 includes a keyboard with which a process administrator performs an input operation of commands to administrate plasma CVD apparatus 100, and a display which visualizes and displays operative conditions of plasma CVD apparatus 100, and so on. Also, in memory part 53, a recipe is stored, in which control programs (software), data of processing conditions, and so on are stored in order that various processes performed in plasma CVD apparatus 100 are implemented by the control of process controller 51.

And, based on necessity, a recipe is called from memory part 53 and executed by process controller 51 so that a desired processing is performed in processing chamber 1 of plasma CVD apparatus 100 under the control of process controller 51. Also, control program and recipe for processing condition data may be stored in a computer-readable storage medium, such as, for example, CD-ROM, hard disk, flexible disk, flash memory, DVD, blu-ray disk. Alternatively, they can be used as an online by being transmitted from other mechanisms, such as, for example, from a dedicated communication line.

Hereinafter, deposition of a silicon nitride film by plasma CVD method using RLSA type plasma CVD apparatus 100 will be described. First, wafer W is brought in treatment vessel 1 from carry in/out entrance 16 by opening gate valve 17, and arranged on mount table 2. Next, while inside treatment vessel 1 is depressurized and exhausted, each of nitrogen gas, silicon-containing compound gas and rare gas, if needed, is introduced from nitrogen-containing gas supply source 19a, silicon-containing compound gas supply source 19b and inert gas supply source 19c of gas supply device 18, respectively, into treatment vessel 1 at a predetermined flow rate via gas introduce holes 14, 15. As a result, the inside of treatment vessel 1 is adjusted with a predetermined pressure.

Next, microwave having a predetermined frequency of, for example, 2.45 GHz, generated in microwave generator 39 is induced to waveguide 37 via matching circuit 38. The induced microwave to waveguide 37 passes through rectangular waveguide 37b and coaxial waveguide 37a sequentially, and is propagated to oblate waveguide in a radial direction. And then, the microwave is supplied to planar antenna plate 31. That is, the microwave is propagated towards planar antenna plate 31 in coaxial waveguide 37a. Subsequently, the microwave propagated in a radial direction in oblate waveguide formed with cover member 34 and planar antenna 31, is radiated towards the upper space of the wafer W in treatment vessel 1 via transmission plate 28 from slot-typed microwave radiation hole 32 of planar antenna plate 31. The microwave output is preferable in the range of 0.25~2.56 W/cm$^2$ as power density per area of transmission plate 28. The microwave output can be selected, for example, in the range of 500~5000 W, according to the purpose, so that the power density can be in the above range.

By the microwave radiated in treatment vessel 1 via transmission plate 28 from planar antenna 31, electromagnetic field is formed in treatment vessel 1, and each of nitrogen-containing gas and silicon-containing compound gas respectively becomes a plasma state. And the raw gases are efficiently dissociated in plasma, and thin film of silicon nitride, SiN, is deposited by the reaction of active species such as ion and radical, for example, $Si_pH_q$, $SiH_q$, $NH_q$, N (p, q are arbitrary numbers, and the same hereinafter).

In plasma CVD apparatus 100 including the above constitutions, the band gap size of the silicon nitride film can be controlled to a predetermined size in the range of 2.5 eV and 7 eV, by keeping the pressure conditions of plasma CVD process constant, and changing the flow ratio of silicon-containing compound gas and nitrogen gas (silicon-containing compound gas/nitrogen gas flow ratio) in the range of 0.005 and 0.2 when the silicon nitride film is formed. For instance, when the processing pressure is in the range of 0.1 Pa and 4 Pa, the deposition reaction of the silicon nitride film is determined by the supply of silicon-containing compound molecules which are the precursor. Therefore, when the ratio of silicon-containing compound gas to nitrogen gas is low, nitrogen becomes relatively rich in the silicon nitride film and the energy band gap becomes large. In contrast, by raising the ratio of silicon-containing compound gas in the pressure range of 0.1 Pa and 4 Pa, silicon can become relatively rich in the silicon nitride film and the energy band gap can become small.

Meanwhile, when the processing pressure is in the range of, for example, 40 Pa and 1333 Pa, the deposition rate of silicon nitride film is strongly inclined to be determined by the reaction. Therefore, when the processing pressure is in the range of 40 Pa and 1333 Pa, even if the ratio of silicon-containing compound gas is increased, silicon does not become rich in the silicon nitride film, rather nitrogen becomes relatively rich. As a result, the energy band gap can become large. In contrast, if the ratio of silicon-containing compound gas to nitrogen gas is lowered, silicon becomes relatively rich in silicon nitride film and the energy band gap can become small.

As described above, plasma CVD apparatus 100 is characterized in that the band gap size can be controlled by changing the amount of nitrogen or silicon contained in the silicon nitride film to have a good response according to flow ratio of $Si_2H_6/N_2$ in the film-forming raw gas. That is, in other type of plasma CVD apparatuses such as ICP and a thermal CVD, even if the flow ratio of $Si_2H_6/N_2$ of film-forming raw gas is changed, the composition of the silicon nitride film does not change on a large scale from the stoichiometric proportion ($Si_3N_4$). As a result, it is substantially impossible to intentionally form the silicon nitride film of a nitrogen-rich film or a silicon-rich film. Therefore, the band gap of the silicon nitride film cannot be controlled with a high accuracy in the conventional plasma CVD apparatus or thermal CVD apparatus. In contrast, in the present invention, by using plasma CVD apparatus 100 which can generate microwave excited high-density plasma, the ratio of Si/N in the silicon nitride film can be changed with a good controllability according to the flow ratio of $Si_2H_6/N_2$ in the film-forming raw gas. As a result, a silicon nitride film having a predetermined band gap can readily be formed.

Figure 4A:
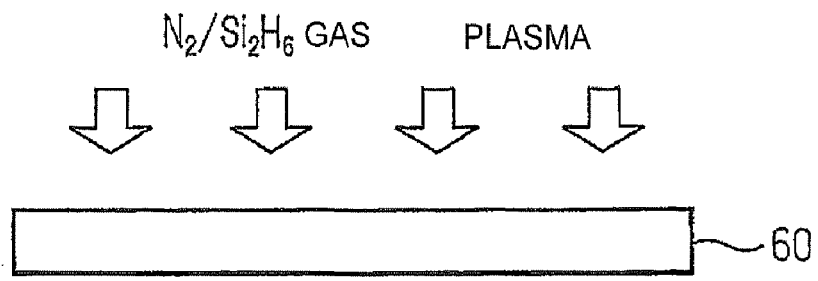
FIG. 4A and FIG. 4B are views illustrating examples of processing for producing the silicon nitride films according to a first embodiment.
Figure 4B:
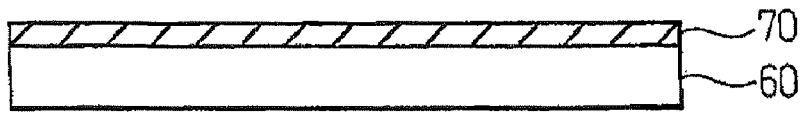

FIG. 4a and FIG. 4b are process diagrams illustrating the manufacturing process of silicon nitride film in plasma CVD apparatus 100. As shown in FIG. 4a, on a foundation layer 60 (e.g. silicon dioxide film), plasma CVD process is performed with the processing pressure using $Si_2H_6/N_2$ plasma. The plasma CVD process is controlled such that silicon-containing compound gas and nitrogen gas are used as film forming gas, the processing pressure is kept constant in the range of 0.1 Pa and 4 Pa, or in the range of 40 Pa and 1333 Pa, and the ratio of silicon-containing compound gas/nitrogen gas is controlled in the range of 0.005 and 0.2. By this, as shown in FIG. 4b, silicon nitride film 70 having the band gap size in the range of 2.5 eV and 7 eV, can be deposited.

Figure 5:
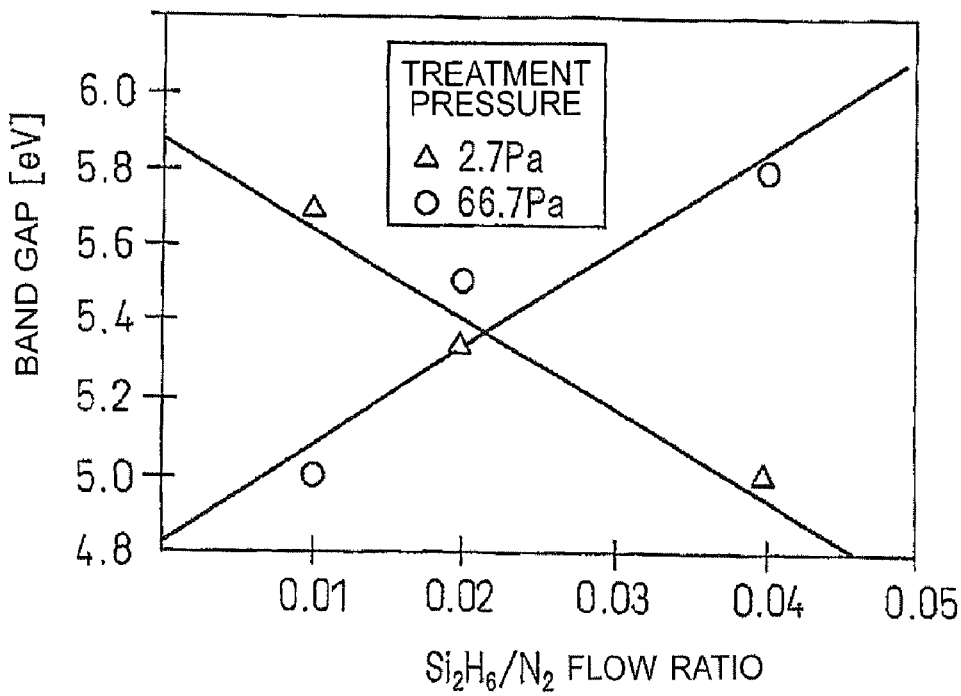
FIG. 5 is a graph illustrating the relationship between the gas ratio of the silicon-containing compound gas/nitrogen and the band gap in the plasma CVD.

Next, experimental data on which the present invention is based is described. FIG. 5 illustrates the relationship between the band gap of the silicon nitride film and the processing pressure in the case where a single film of silicon nitride is deposited using conditions where $N_2$ gas is used as a nitrogen-containing gas and $Si_2H_6$ gas as a silicon-containing gas, plasma CVD is performed in plasma CVD apparatus 100, and a single film of silicon nitride is deposited. The experimental conditions for the plasma CVD are as follows:

[Experimental Conditions for Plasma CVD]
Processing temperature (mount table): 500° C.
Microwave power: 2 kW (power density 1.023 W/cm$^2$; per area of transmission plate)
Processing pressure: 2.7 Pa (20 mTorr), 66.7 Pa (500 mTorr)
Flow rate of Ar gas: 200 mL/min (sccm)
Flow rate of $N_2$ gas: 200 mL/min (sccm)
Flow rate of $Si_2H_6$ gas: 2 mL/min (sccm), 4 mL/min (sccm) or 8 mL/min (sccm)

The band gap of the silicon nitride film was measured using a thin-film property measuring apparatus, n&k•Analyzer (name of product, produced by n&k Technologies Corp.)

As shown in FIG. 5, the band gap of the silicon nitride film is changed in the range of about 4.8 eV and 6.0 eV when the silicon nitride film is deposited by using plasma CVD apparatus 100. For the silicon nitride film, $N_2$ gas has been used as a nitrogen-containing gas, $Si_2H_6$ gas has been used as a silicon-containing compound gas, and Ar gas has been used as an inert gas. Also, the processing pressure has been set to be 2.7 Pa (20 mTorr) or 66.7 Pa (500 mTorr), and the flow rate of $Si_2H_6/N_2$ has been changed in the range of 0.01 and 0.04. That is, silicon nitride film having any predetermined band gap can readily be deposited by keeping the processing pressure constant and changing the flow ratio of $Si_2H_6/N_2$, thereby controlling the ratio of Si/N in the silicon nitride film. Also, as shown in the experimental results in FIG. 5, the band gap size can be adjusted by changing the pressure even for the same $Si_2H_6/N_2$ flow ratio (e.g. 0.01 or 0.04 of $Si_2H_6/N_2$ flow ratio).

For a comparison, silicon nitride film has been formed with LPCVD by changing the processing pressure as the same manner. However, the band gap has been changed merely in the range of 4.9 eV and 5 eV, and the control of the band gap with the LPCVD has been difficult (Experimental results are not illustrated).

As described above, it has been confirmed that the primary factor for determining the band gap size is a flow ratio of silicon-containing compound gas/nitrogen gas in the plasma CVD process using plasma CVD apparatus 100. That is, it has been confirmed that a silicon nitride film having either a relatively large band gap or a relatively small band gap can readily be formed by using plasma CVD apparatus 100 in which other conditions are kept constant and only the flow ratio of silicon-containing compound gas/nitrogen gas has been changed, thereby controlling the ratio of Si/N in the film.

In order to deposit silicon nitride film having a band gap size in the range of 2.5 eV and 7 eV, it is preferable to set the processing pressure in the range of 0.1 Pa and 4 Pa or in the range of 40 Pa and 1333 Pa, and select the flow ratio silicon-containing compound gas/nitrogen gas in the range of 0.0005 and 0.2, and more preferably in the range of 0.005 and 0.1. Alternatively, when the film forming gas includes ammonia gas, the flow ratio of the silicon-containing compound gas to ammonia gas (silicon-containing compound gas/ammonia gas) may be selected in the range of 0.015 and 0.2. Also, the flow rate of Ar gas may be set in the range of 0 (not supplied) and 1000 mL/min (sccm), preferably in the range of 50 and 80 mL/min (sccm). And the flow rate of $N_2$ gas may be set in the range of 100 and 800 mL/min (sccm), preferably in the range of 100 and 400 mL/min (sccm). And the flow rate of $Si_2H_6$ gas can be set in the range of 1 and 400 mL/min (sccm), preferably in the range of 3 and 30 mL/min (sccm).

Also, the temperature of mount table 2 in the plasma CVD process is set to be 300° C. or more, preferably in the range of 400° C. and 600° C.

Also, the power density of microwave in the plasma CVD process is preferably set in the range of 0.256 and 2.045 $W/cm^2$ per area of the transmission plate.

As described above, in the process of forming silicon nitride film of the present invention, silicon-containing compound gas and nitrogen gas are used as a film forming gas, and the plasma CVD is performed by selecting the flow ratio of silicon-containing compound gas/nitrogen gas and processing pressure. As a result, the Si/N ratio inside the film can be controlled and silicon nitride film having various band gap sizes can readily be formed on a wafer W.

Second Embodiment

Next, a producing process for a silicon nitride film laminate will be described according to the second embodiment of the present invention. As explained above for the first embodiment, in plasma CVD apparatus 100, the plasma CVD process condition, specifically, the flow ratio of silicon-containing compound gas/nitrogen gas is selected. Therefore, the Si/N ratio inside the silicon nitride film can be controlled and the band gap size of the silicon nitride film can be controlled to a predetermined size. As a result, a plurality of silicon nitride films in which the band gap size of adjacent films is different from each other can readily be produced.

Figure 6A:
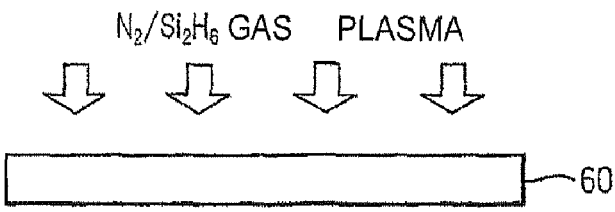
FIG. 6A~FIG. 6F are views illustrating examples of processing for producing a silicon nitride film laminate according to a second embodiment.
Figure 6B:
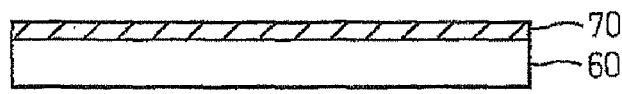
Figure 6C:
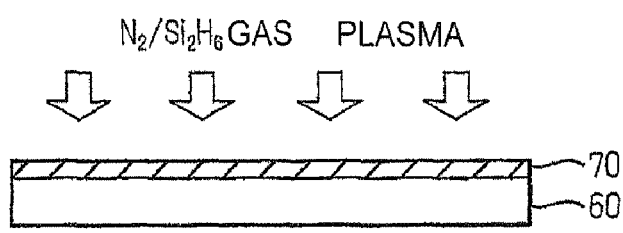
Figure 6D:
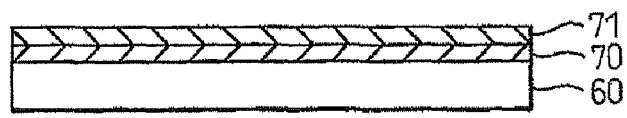
Figure 6E:
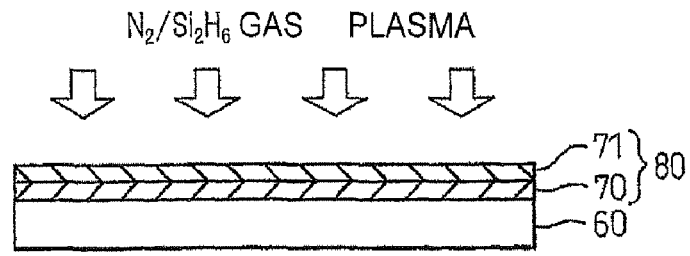
Figure 6F:
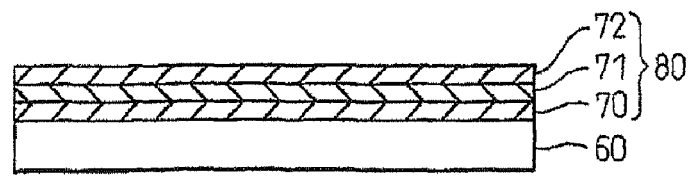

FIG. 6a~FIG. 6f are process diagrams illustrating the producing process of silicon nitride film laminate in plasma CVD apparatus 100. At first, as shown in FIG. 6a, plasma CVD process is performed on an arbitrary foundation layer 60 (e.g., silicon dioxide film) with a first flow ratio ($Si_2H_6/N_2$ flow ratio) using $Si_2H_6/N_2$ plasma, and as shown in FIG. 6b, a first silicon nitride film 70 having a first band gap is deposited. Next, as shown in FIG. 6c, plasma CVD process is performed on the first silicon nitride film 70 with a second flow ratio ($Si_2H_6/N_2$ flow ratio) using $Si_2H_6/N_2$ plasma, and as shown in FIG. 6d, a second silicon nitride film 71 having a second band gap is deposited. By this, silicon nitride film laminate 80 including two-layered silicon nitride films can be deposited. Also, if needed, as shown in FIG. 6e, plasma CVD process is performed on the second silicon nitride film 71 with a third flow ratio ($Si_2H_6/N_2$ flow ratio) using $Si_2H_6/N_2$ plasma, and as shown in FIG. 6f, a third silicon nitride film 72 having a third band gap may be deposited. Thereafter, silicon nitride film laminate 80 having a predetermined layer structure can be deposited by repeatedly performing the plasma CVD process.

In the process for producing the silicon nitride film laminate of the present invention, the plasma CVD is performed with conditions in which silicon-containing compound gas and nitrogen gas are used as a film forming gas, the flow ratio of silicon-containing compound gas/nitrogen gas is selected in the range of 0.005 and 0.2, and the processing pressure is maintained constant in the range of 0.1 Pa and 4 Pa, or in the range of 40 Pa and 1333 Pa. As a result, the Si/N ratio in the film is controlled to change the band gap of the silicon nitride film in the range of, for example, 2.5 eV and 7 eV. That is, the Si/N ratio in the film can be controlled and the band gap sizes of first silicon nitride film 70, second silicon nitride film 71, and third silicon nitride film 72 can be controlled in the range of 2.5 eV and 7 eV by keeping the treatment pressure constant in the range of 0.1 Pa and 4 Pa, or in the range of 40 Pa and 1333 Pa, and changing the first flow ratio, the second flow ratio and the third flow ratio in the range of 0.005 and 0.2.

For example, if the processing pressure is set to be constant in the range of 0.1 Pa and 4 Pa, and the flow ratio of silicon-containing compound gas/nitrogen gas is selected in the range of 0.005 and 0.2 so that the condition satisfies a relationship where the first flow ratio<the second flow ratio<the third flow ratio, silicon nitride film laminate 80 can be deposited having an energy band structure in which the band gap size satisfies a relationship where first silicon nitride film 70>second silicon nitride film 71>third silicon nitride film 72. Also, if the processing pressure is set to be constant in the range of 40 Pa and 1333 Pa, and silicon-containing compound gas/nitrogen gas flow ratio is selected in the range of 0.005 and 0.2 so that the condition satisfies a relationship where the first flow ratio<the second flow ratio<the third flow ratio, silicon nitride film laminate 80 can be deposited having an energy band structure in which the band gap size satisfies a relationship where first silicon nitride film 70<second silicon nitride film 71<third silicon nitride film 72. For example, it is also possible to produce an energy band gap structure that satisfies first silicon nitride film 70=third silicon nitride film 72 by setting the first flow ratio and the third flow ratio to be equal.

Here, in order to deposit a silicon nitride film having the band gap size, for example, in the range of 2.5 eV and 5 eV, it is preferable to set the processing pressure in the range of 0.1 Pa and 4 Pa and select the silicon-containing compound gas/ nitrogen gas flow ratio in the range of 0.04 and 0.2. Or, the processing pressure is preferably set in the range of 40 Pa and 1333 Pa, and the flow ratio of silicon-containing compound gas/nitrogen gas is preferably selected in the range of 0.005 and 0.01. In the above, Ar gas flow rate can be set in the range of 0 and 1000 mL/min (sccm), preferably in the range of 50 and 800 mL/min (sccm), $N_2$ gas flow rate can be set in the range of 100 and 800 mL/min (sccm), preferably in the range of 100 and 400 mL/min (sccm), and $Si_2H_6$ gas flow rate can be set in the range of 1 and 40 mL/min (sccm), preferably in the range of 2 and 20 mL/min (sccm).

Also, in order to form a silicon nitride film having the band gap size, for example, in the range of 5 eV and 7 eV, it is preferable to set the processing pressure in the range of 0.1 Pa and 4 Pa, and select the flow ratio of silicon-containing compound gas/nitrogen gas in the range of 0.005 and 0.2. Alternatively, the processing pressure may be set to be constant in the range of 40 Pa and 1333 Pa, and the flow ratio of silicon-containing compound gas/nitrogen gas may be set in the range of 0.01 and 0.2. In this case, Ar gas flow rate may be set in the range of 0 and 1000 mL/min (sccm), preferably in the range of 50 and 800 mL/min (sccm), $N_2$ gas flow rate may be set in the range of 100 and 800 mL/min (sccm), preferably in the range of 100 and 400 mL/min (sccm), and $Si_2H_6$ gas flow rate may be set in the range of 1 and 40 mL/min (sccm), preferably in the range of 2 and 20 mL/min(sccm).

Also, as for the processing temperature of the plasma CVD process above, the temperature of mount table 2 is set to be 300° C. or more, preferably in the range of 400° C. and 600° C.

Also, in the above, it is preferable to set the power density of microwave in the plasma CVD process in the range of 0.256 and 2.045 w/cm$^2$ at per area of the transmission plate.

In the process for producing the silicon nitride film laminate of the present invention, the plasma CVD is performed with conditions in which silicon-containing compound gas and nitrogen gas are used as a film forming gas, the flow ratio of silicon-containing compound gas/nitrogen gas and processing pressure are selected to alternately deposit silicon nitride films each having different band gaps thereby forming a silicon nitride film laminate on a wafer W. In particular, in the producing process of the silicon nitride film laminate of the present invention, the processing pressure is kept constant, and the Si/N ratio can readily be controlled by the flow ratio of silicon-containing compound gas/nitrogen gas to control the size of the band gap. As a result, when forming a laminated structure of silicon nitride films each having a different band gap, a continuous film forming can be performed in the same processing chamber by maintaining the vacuum state. Accordingly, it is advantageous to improve the process efficiency.

Also, because the band gap of the silicon nitride film can readily be adjusted by keeping the processing pressure constant and controlling the Si/N ratio in the film only with the adjustment of the flow ratio of silicon-containing compound gas/nitrogen gas, silicon nitride film laminate having various band gap structures can be easily produced. Therefore, when the present invention is applied to depositing the silicon nitride film laminate working as a charge-accumulating area of a MOS-type semiconductor memory device, the MOS-type semiconductor memory device can be produced to have a superior data storage, high-speed data re-writing, operability in low-power consumption, and a high reliability.

Third Embodiment

Figure 7:
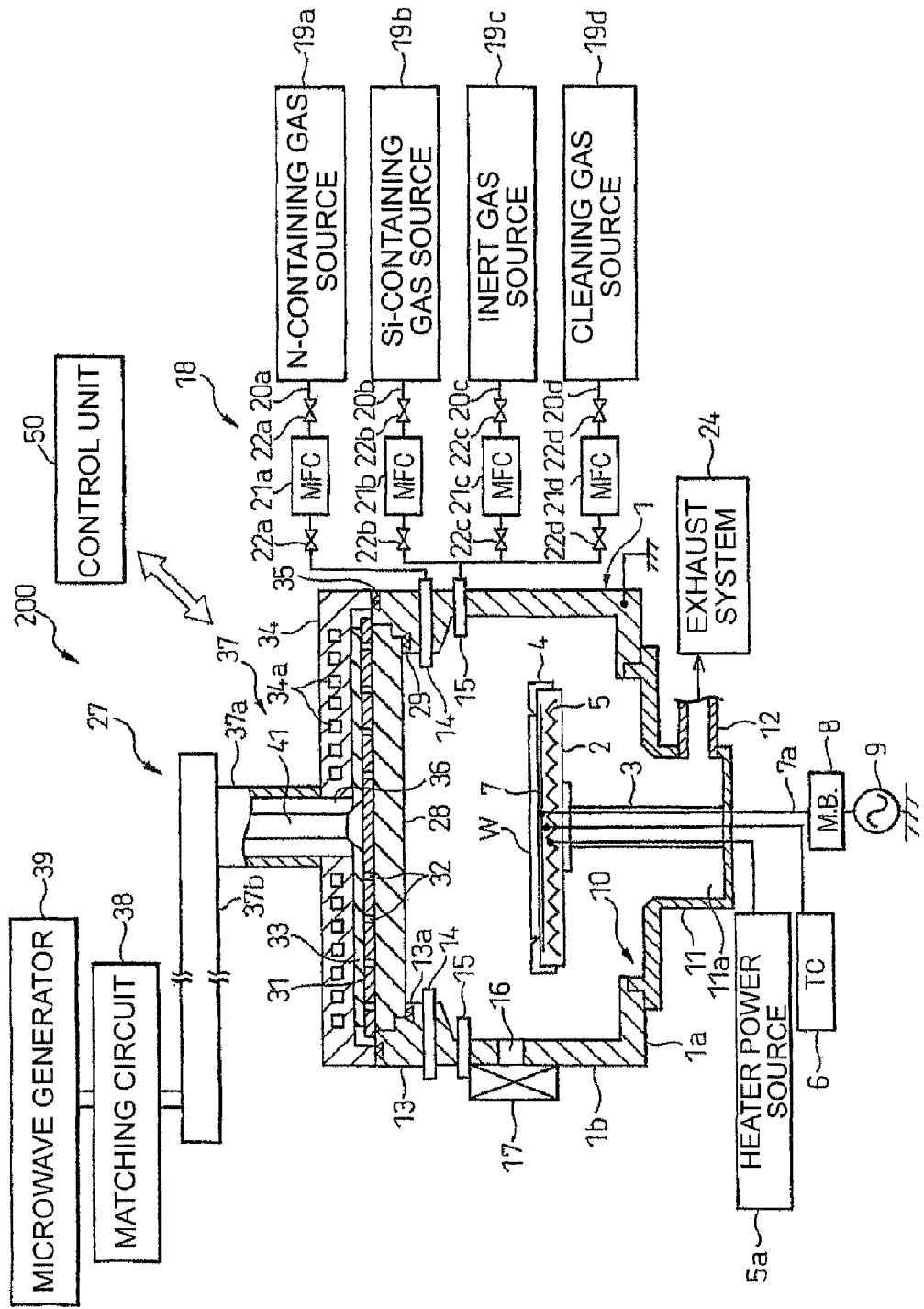
FIG. 7 is a schematic cross sectional view illustrating another example of plasma CVD apparatus adapted to produce the silicon nitride film.

Next, the third embodiment of the present invention is described. While the band gap of a silicon nitride film is changed by the processing pressure of the plasma CVD and the flow ratio of film-forming raw gas in the above first and the second embodiments, the band gap of silicon nitride film can be even more easily changed by applying a high-frequency bias voltage to a wafer W of an object to be treated in the present embodiment. FIG. 7 is a cross-sectional view diagrammatically illustrating a schematic structure of plasma CVD apparatus 200 applicable to the process for producing silicon nitride film according to the present embodiment. Hereinafter, descriptions will be made with respect to the differences from plasma CVD apparatus 100, and the same reference numerals are used for the same elements and descriptions thereof will be omitted.

In plasma CVD apparatus 200, an electrode 7 is embedded on the surface side of mount table 2. Electrode 7 is arranged between a heater 5 and the surface of mount table 2. High-frequency power source 9 for bias is connected with electrode 7 via a matching box 8 (M.B.) by a power supply line 7a. High-frequency bias voltage (RF voltage) can be applied to wafer W of a substrate by supplying the high-frequency power from high-frequency power source 9 to electrode 7. Electrode 7 is preferably made of a material having the same thermal expansion as the ceramics such as AlN from which mount table 2 is made of. For example, conductive materials such as molybdenum and tungsten may preferably be used. Electrode 7 is formed with, for example, a webbing-shape, a grid-shape, a spiral-shape. Electrode 7 may preferably be formed with a size equal to or bigger than the object to be treated.

Next, the deposition process of a silicon nitride film by the plasma CVD method using plasma CVD apparatus 200 will be described. At first, when gate valve 17 is opened, wafer W is brought in treatment vessel 1 via carry in/out entrance 16 and wafer W is placed on mount table 2. Thereafter, the inside of treatment vessel 1 is depressurized and exhausted, and each of nitrogen-containing gas, silicon-containing compound gas and inert gas (e.g. Ar gas) is introduced into treatment vessel 1 with a predetermined flow rate, respectively, from nitrogen-containing gas source 19a, silicon-containing compound gas source 19b and inert gas source 19c via first gas introduce hole 14 and second gas introduce hole 15. And the inside of treatment vessel 1 is adjusted to a predetermined pressure.

Next, microwave generated by microwave generator 39 having a predetermined frequency, for example, 2.45 GHz, is induced to waveguide 37 via matching circuit 38. The induced microwave to waveguide 37 sequentially passes through rectangular waveguide 37b and coaxial waveguide 37a, and is supplied to planar antenna plate 31 via inner conducting body 41. That is, the microwave is propagated towards planar antenna plate 31 in coaxial waveguide 37a. And the microwave is radiated to the upper space of wafer W in treatment vessel 1 from the slot-type microwave radiation hole 32 of planar antenna plate 31 via transmission plate 28. It is preferable to set the microwave output in the range of 0.25 and 2.56 W/cm$^2$ as an output density per area of transmission plate 28 of the region where the microwave permeates. Microwave output can be selected to have the output density within the above range, for example, in the range of 500 and 5000 W, depending on the needs.

Electro-magnetic field is generated in treatment vessel 1 by the microwave radiated therein from planar antenna 31 via transmission plate 28, and Ar gas, nitrogen-containing gas, and silicon-containing compound gas become plasma. And the raw gases are dissociated efficiently in plasma, and a thin film of silicon nitride film SiN is deposited by the reaction of the active species such as ions and radicals including, for example, $Si_pH_q$, $SiH_q$, $NH_q$, and N.

Also, while the plasma CVD process is carried out, a high-frequency power (RF bias) of a predetermined frequency and magnitude is supplied to electrode 7 of mount table 2 from high-frequency power source 9 thereby applying the high frequency power to wafer W. In plasma CVD apparatus 200, damages of films can be prevented because the electron temperature of plasma can be kept low. Also, the reaction is facilitated because the molecules of film-forming gas can be easily dissociated by the high-density plasma. Also, the Si/N ratio of the produced silicon nitride film can be controlled thereby changing the band gap because the application of the RF bias in a proper range injects the ions of the plasma into wafer W.

In the present embodiment, it is preferable to set the frequency of RF bias supplied from high-frequency power source 9 to be, for example, in the range of 400 kHz and 60 MHz, and more preferable in the range of 450 kHz and 20 MHz. Also, in the present embodiment, it is preferable to supply RF bias as the output density per area of wafer W, for example, in the range of 0.01 W/cm$^2$ and 0.64 W/cm$^2$, and more preferable in the range of 0.032 W/cm$^2$ and 0.16 W/cm$^2$. Also, in the present embodiment, when RF bias may be supplied to have the above output density, and the RF bias output may preferably be set in the range of 1 W and 200 W, and more preferably in the range of 1 W and 50 W.

The above conditions are stored as a recipe in memory part 53 of control unit 50. And a process controller 51 reads the recipe, and transmits control signals to each constitutional part of plasma CVD apparatus 200, for example, gas supply device 18, exhaust system 24, microwave generator 39, heater power source 5a, and high-frequency power source 9, thereby implementing the plasma CVD process at a predetermined condition.

Also, in plasma CVD apparatus 200 having the above constitutions, when a silicon nitride film is formed, a high-frequency power is supplied from high-frequency power source 9 to electrode 7 of mount table 2 with the output density range of 0.01 W/cm$^2$ and 0.64 W/cm$^2$, preferably in the range of 0.032 W/cm$^2$ and 0.16 W/cm$^2$, and the Si/N ratio of the produced silicon nitride film and the band gap can be controlled by applying the RF bias to wafer W.

Figure 8A:
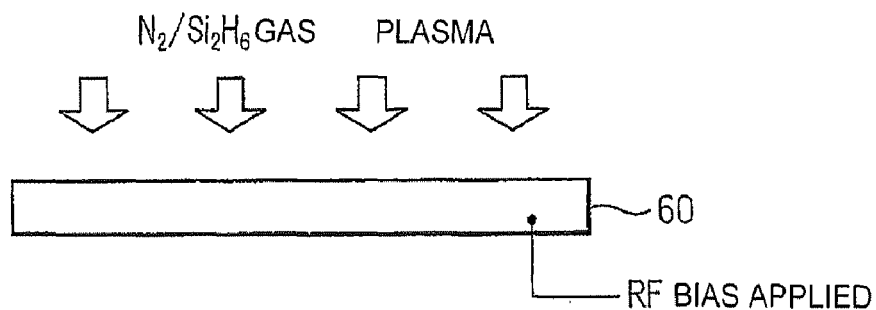
FIG. 8A and FIG. 8B are views illustrating examples of processing for producing the silicon nitride films according to a third embodiment.
Figure 8B:
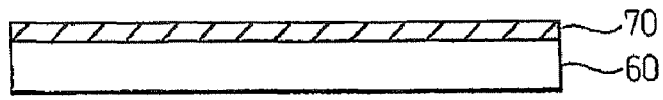

FIGS. 8a and 8b are process diagrams illustrating the producing process of silicon nitride film performed in plasma CVD apparatus 200. As shown in FIG. 8a, a plasma CVD process is performed on an arbitrary foundation layer 60 (e.g. SiO$_2$ film), using N$_2$/Si$_2$H$_6$ plasma. In this plasma CVD process, a high-frequency power is supplied from high-frequency power source 9 to electrode 7 of mount table 2 with an output power density in the range of 0.01 W/cm$^2$ and 0.64 W/cm$^2$, and the RF bias is applied to wafer W. Thereby, as shown in FIG. 8b, silicon nitride film 70 can be formed with the controlled Si/N ratio thereby changing the band gap of silicon nitride film 70.

A plasma CVD is performed with the following conditions, and an experiment has been conducted to evaluate the relationship between the RF bias output supplied during the film forming and the band gap of the silicon nitride film generated by the plasma CVD.

Figure 9:
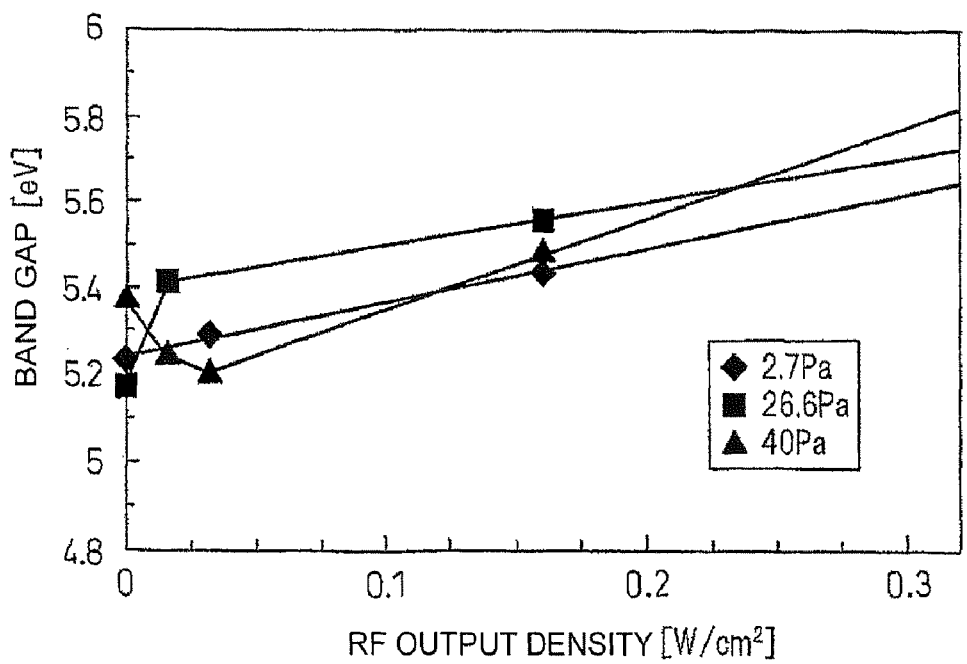
FIG. 9 is a graph illustrating the relationship between the output density of RF bias and the band gap of the silicon nitride film with respect to the processing pressure.

<Plasma CVD Conditions>
Processing temperature (Mount Table): 400° C.
Microwave power: 2 kW (Power density: 1.53 W/cm$^2$; per area of transmission plate)
Processing pressure: 2.7 Pa, 26.6 Pa or 40 Pa
Si$_2$H$_6$ flow rate: 2 mL/min (sccm)
N$_2$ gas flow rate: 400 mL/min (sccm)
Ar gas flow rate: 600 mL/min (sccm)
High-frequency power for RF bias: 0 W (not supplied), 5 W, 10 W, 50 W FIG. 9 illustrates the results of the experiment. When the processing pressure is 2.7 Pa or 26.6 Pa, the Si/N ratio becomes smaller as the high-frequency power for RF bias is increased, and nitrogen becomes richer in the silicon nitride film. As a result, the band gap of the silicon nitride film tends to be increased. When the processing pressure is 40 Pa, it is confirmed that the band gap is increased as the high-frequency power for RF bias to wafer W is increased in the range that the high-frequency power density for RF bias is more than 0.032 W/cm$^2$. In view of the above results, for example, in order to control the band gap size in the range of 5~6 eV, it is preferable to set the processing pressure constant in the range of 0.1 Pa and 1333 Pa, more preferably in the range of 1 Pa and 40 Pa, and select the flow ratio of silicon-containing compound gas and N$_2$ gas (e.g. Si$_2$H$_6$ flow rate/N$_2$ flow rate) in the range of 0.005 and 0.2. Also, the high-frequency power density of RF bias may preferably be set in the range of 0.01 W/cm$^2$ and 0.64 W/cm$^2$, more preferably in the range of 0.032 W/cm$^2$ and 0.16 W/cm$^2$.

Figure 10:
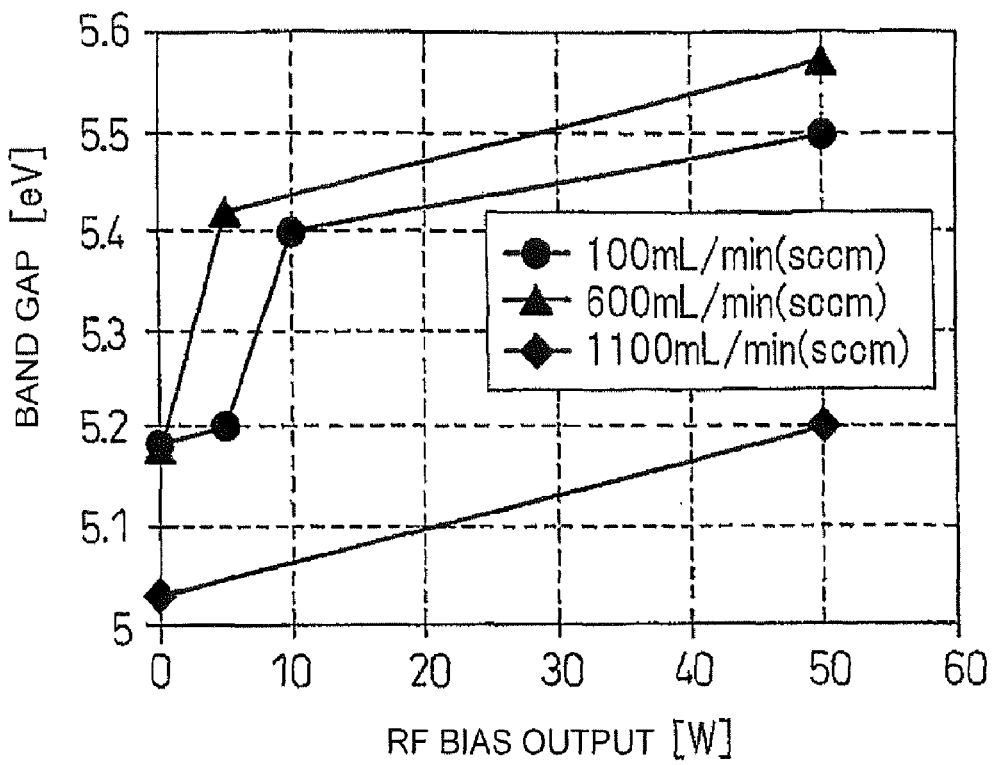
FIG. 10 is a graph illustrating the relationship between the output density of RF bias and the band gap of the silicon nitride film with respect to the Ar flow rate.

Next, an investigation has been conducted to see how the band gap of the silicon nitride film is affected when the processing pressure is kept constant, and the high-frequency power for RF bias and Ar flow rate are changed. The conditions of the plasma CVD are as follows:

<Plasma CVD Conditions>
Processing temperature (Mount Table): 400° C.
Microwave power: 2 kW (Power density: 1.53 W/cm$^2$; per area of transmission plate)
Processing pressure: 26.6 Pa
Si$_2$H$_6$ flow rate: 2 mL/min (sccm)
N$_2$ gas flow rate: 400 mL/min (sccm)
Ar gas flow rate: 100 mL/min (sccm), 600 mL/min (sccm), or 1100 mL/min (sccm)
High-frequency power for RF bias: 0 W (not supplied), 5 W, 10 W, 50 W FIG. 10 illustrates the results of the experiment. In the processing pressure (26.6 Pa) of the experiment, the Si/N ratio becomes smaller and nitrogen becomes richer in the silicon nitride film over the entire range of Ar flow rate, as the high-frequency power for RF bias is increased. Therefore, the band gap tends to become larger. However, when Ar flow rate is 1100 mL/min (sccm), the change width of the band gap is merely 0.2 eV. In the mean time, when Ar flow rate is 100 mL/min (sccm) or 600 mL/min (sccm), the change width of the band gap is approximately 0.4 eV, and it is confirmed that the effect of applying the RF bias is remarkable. Accordingly, from the view point of readily controlling the band gap size in the present embodiment, the flow rate of Ar gas may preferably be in the range of 0 (not supplied)~1000 mL/mLin (sccm) when RF bias is applied, more preferably in the range of 100~600 mL/mLin (sccm).

Here, other constitutions and effects in the third embodiment are the same as in the first embodiment. Also, instead of changing the first to third flow ratio (Si$_2$H$_6$/N$_2$ flow ratio) as in the second embodiment, a silicon nitride film laminate can be produced by changing the RF bias size with respect to wafer W as described in the third embodiment.

Fourth Embodiment

Figure 11A:
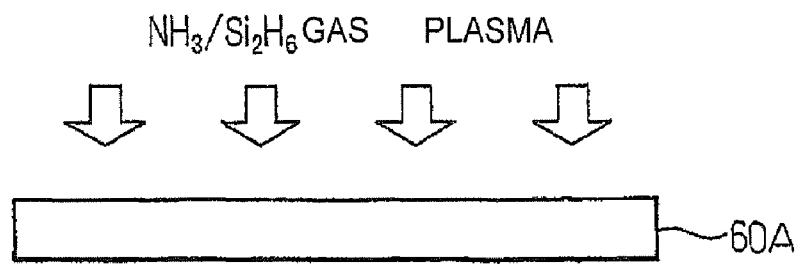
FIG. 11A and FIG. 11B are views illustrating examples of processing for producing the silicon nitride films according to a fourth embodiment.
Figure 11B:
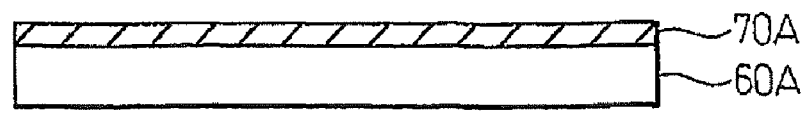

FIGS. 11a and 11b are drawings for explaining the process of producing a silicon nitride film according to fourth embodiment of the present invention, and process diagrams illustrating the manufacturing process of the silicon nitride film performed in plasma CVD apparatus 100. Ammonia gas (NH$_3$ gas) is used as a nitrogen-containing gas in the present embodiment. As shown in FIG. 11a, a plasma CVD process is performed on an arbitrary foundation layer 60A (e.g. silicon dioxide film) with the processing pressure using Si$_2$H$_6$/NH$_3$ plasma. Here, silicon-containing compound gas and ammonia gas are used as a film forming gas, the flow ratio of silicon-containing compound gas/ammonia gas is set in the range of 0.015 and 0.2, and the treatment pressure is selected in the range of 0.1 Pa and 1333 Pa to perform the CVD process. Thereby, silicon nitride film 70A having the band gap size in the range of 2.5 eV and 7 eV can be deposited, as shown in FIG. 11b.

In the process of producing the silicon nitride film of the present invention, the band gap of the deposited silicon nitride film tends to be increased as the processing pressure is increased in the range of 0.1 Pa and 1333 Pa. Therefore, the band gap size of silicon nitride film 70A can be controlled in the range of 2.5 eV~7 eV by selecting the processing pressure in the range of 0.1 Pa and 1333 Pa.

Figure 12:
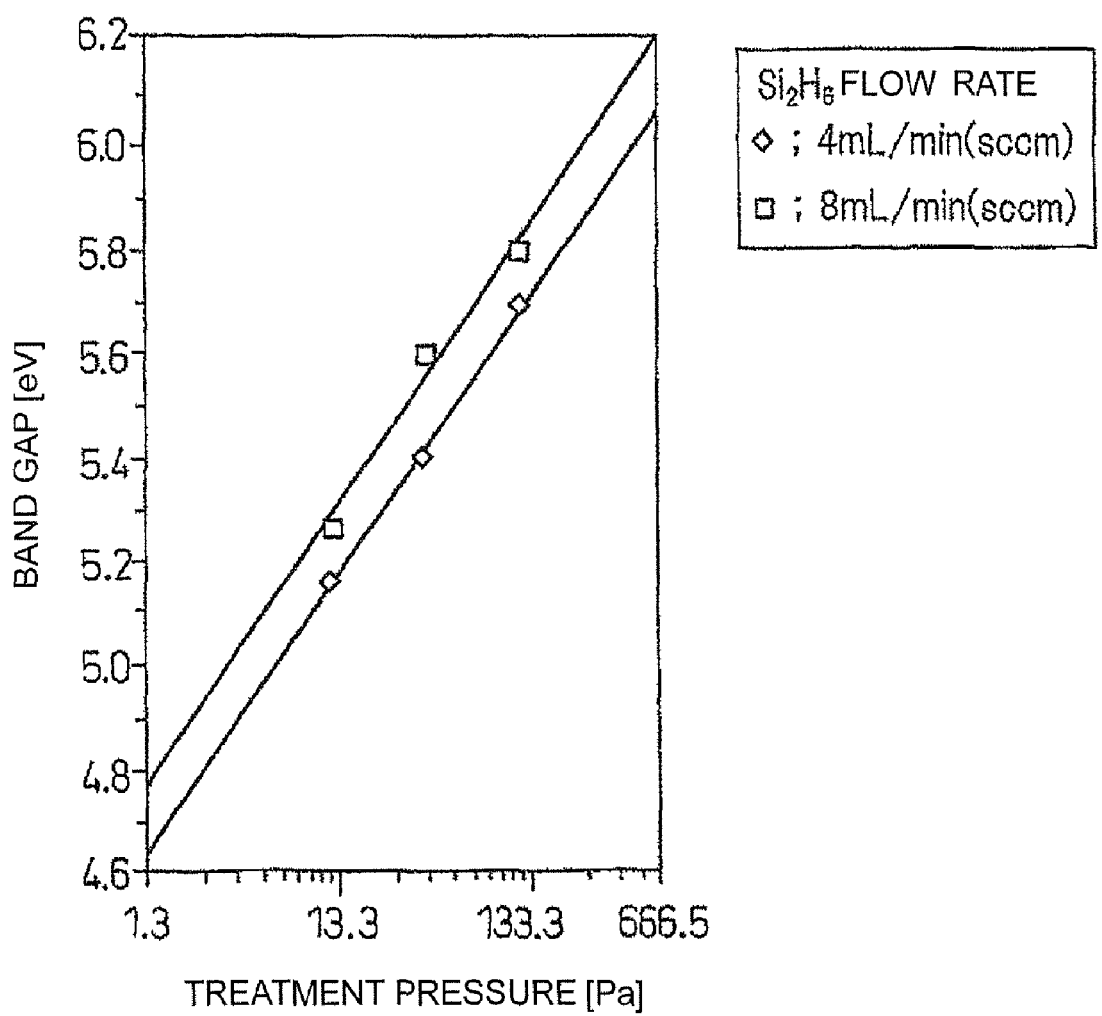
FIG. 12 is a graph illustrating the relationship between the processing pressure and the band gap in the plasma CVD.

Next, descriptions will be made for experimental data on which the present invention is based. FIG. 12 illustrates the relationship between the band gap of the silicon nitride film and the processing pressure in a case when a single-layer silicon nitride film is produced by using $NH_3$ gas as a nitrogen-containing gas and $Si_2H_6$ gas as a silicon-containing compound gas, and performing plasma CVD in plasma CVD apparatus 100. The conditions of Plasma CVD are as follows:

<Plasma CVD Conditions>
Processing temperature (Mount Table): 500° C.
Microwave power: 2 kW (Power density: 1.023 W/cm²; per area of transmission plate)
Processing pressure: 13.3 Pa (100 mTorr), 66.7 Pa (500 mTorr), 126 Pa (950 mTorr), and 200 Pa (1500 mTorr)
Ar flow rate: 200 mL/min (sccm)
$NH_3$ gas flow rate: 200 mL/min (sccm)
$Si_2H_6$ gas flow rate: 4 mL/min (sccm) or 8 mL/min (sccm)

The band gap of the silicon nitride film has been measured using a thin-film property measuring apparatus, n&k•Analyze r(name of product, produced by n&k Technologies Corp.).

As shown in FIG. 12, using plasma CVD apparatus 100, when $NH_3$ gas, $Si_2H_6$ gas, Ar gas are used as a nitrogen-containing gas, a silicon-containing compound gas, an inert gas, respectively, and the processing pressure is changed in the range of 13.3 Pa~133.3 Pa, the band gap of the deposited silicon nitride film has been changed approximately in the range of 5.1 eV~5.8 eV. In this case, silicon nitride film having a predetermined band gap can be easily deposited by keeping the flow rate of $Si_2H_6$ gas constant and only changing the processing pressure. Also, it is preferable to control the processing pressure mainly and auxiliarily to control the flow rate of $Si_2H_6$, if needed. Flow rates of the raw gases for making the band gap with the above range are as follows. It is preferable to set the flow rate of $Si_2H_6$ in the range of 3 mL/min (sccm) and 40 mL/min (sccm), and more preferably in the range of 3 mL/min (sccm) and 20 mL/min (sccm). It is preferable to set the flow rate of $NH_3$ in the range of 50 mL/min (sccm) and 1000 mL/min (sccm), and more preferably in the range of 50 mL/min (sccm) and 500 mL/min (sccm). Also, it is preferable to set the flow ratio of $Si_2H_6$ gas and $NH_3$ gas ($Si_2H_6/NH_3$ ratio) in the range of 0.015 and 0.2, and more preferably in the range of 0.015 and 0.1. For a comparison, silicon nitride film has been formed with LPCVD by changing the processing pressure as the same manner. However, the band gap has been changed merely in the range of 4.9 eV~5 eV, and the control of the band gap with the LPCVD has been difficult (Experimental results are not illustrated).

As described above, it is confirmed that the primary factor to determine the band gap size of a deposited film is the processing pressure in the plasma CVD process using plasma CVD apparatus 100. Therefore, it is also confirmed that silicon nitride films having either a relatively large band gap or a relatively small band gap can readily be formed by maintaining the other conditions constant and only changing the processing pressure to control the size of the band gap using plasma CVD apparatus 100.

In order to deposit silicon nitride film having the band gap size in the range of 2.5 eV and 7 eV, it is preferable to set the flow ratio (silicon-containing compound gas/ammonia gas flow ratio) of silicon-containing compound gas (e.g. $Si_2H_6$ gas) and ammonia gas in the range of 0.015 and 0.2, and set the processing pressure in the range of 0.1 Pa and 1333 Pa. Also, the flow rate of Ar gas may be set in the range of 0~1000 mL/min (sccm), preferably in the range of 50~800 mL/min (sccm). The flow rate of $NH_3$ gas may be set in the range of 100~800 mL/min (sccm), preferably in the range of 100~400 mL/min (sccm). The flow rate of $Si_2H_6$ gas may be set in the range of 1~400 mL/min (sccm), preferably in the range of 3~30 mL/min (sccm). Each of these flow rates may be set such that the flow ratio condition is satisfied as indicated above.

Also, as for the processing temperature of plasma CVD process, the temperature of mount table 2 is set to be 300° C. or more, preferably in the range of 400° C. and 600° C.

Also, the power density of microwave in the plasma CVD process is preferably set in the range of 0.256 W/cm² and 2.045 W/cm² per area of the transmission plate.

In the process of forming silicon nitride film of the present invention, silicon-containing compound gas and ammonia gas are used as a film forming gas, and the plasma CVD is performed by selecting the flow ratio of silicon-containing gas/nitrogen gas in the range of 0.015 and 0.2, and selecting the processing pressure in the range of 0.1 Pa and 1333 Pa. As a result, silicon nitride film having various band gap size can readily be formed on a wafer W.

Fifth Embodiment

Next, a producing process for a silicon nitride film laminate according to the fifth embodiment of the present invention will be described. As described in the above first~fourth embodiments, in plasma CVD apparatus 100, the plasma CVD process condition for forming the silicon nitride film, specifically, the pressure condition, is selected to control the band gap size of the deposited silicon nitride film to have a predetermined value. Accordingly, for example, a silicon nitride film laminate can readily be produced.

Figure 13A:
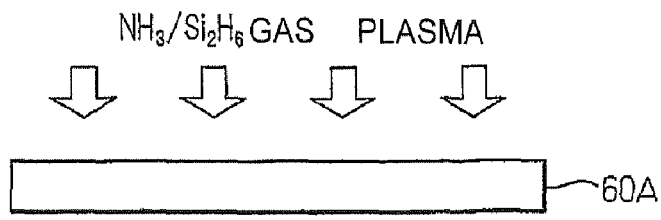
FIG. 13A~FIG. 13F are views illustrating examples of processing for producing the silicon nitride film laminate according to a fifth embodiment.
Figure 13B:
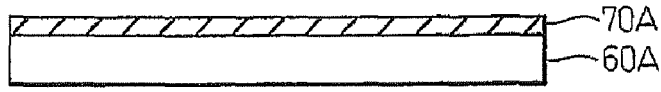
Figure 13C:
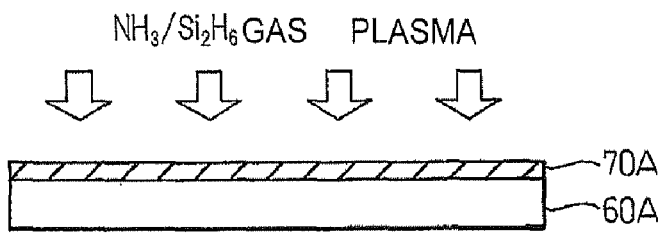
Figure 13D:
Figure 13E:
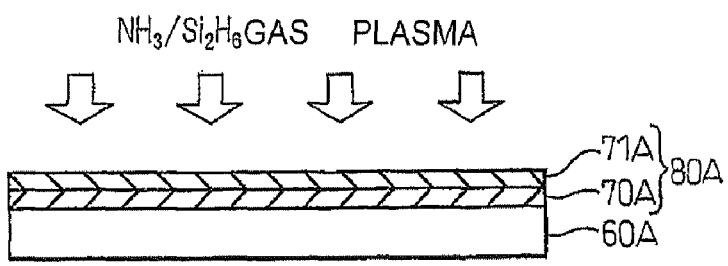
Figure 13F:
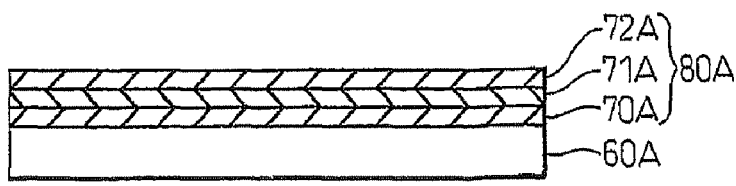

FIG. 13a~FIG. 13f are process diagrams illustrating the producing process of silicon nitride film laminate in plasma CVD apparatus 100. At first, as shown in FIG. 13a, plasma CVD process is performed on an arbitrary foundation layer 60A (e.g. silicon dioxide film) with a first processing pressure, using $Si_2H_6/NH_3$ plasma. Next, as shown in FIG. 13b, a first silicon nitride film 70A having a first band gap is deposited. Next, as shown in FIG. 13c, plasma CVD process is performed on first silicon nitride film 70A with a second processing pressure, using $Si_2H_6/NH_3$ plasma, and as shown in FIG. 13d, a second silicon nitride film 71A having a second band gap is deposited. By this, silicon nitride film laminate 80A including two layers of silicon nitride films can be deposited. Also, if needed, as shown in FIG. 13e, plasma CVD process can be performed on second silicon nitride film 71A with a third processing pressure, using $Si_2H_6/NH_3$ plasma, and as shown in FIG. 13f, a third silicon nitride film 72A having a third band gap may be deposited. Thereafter, the plasma CVD process may be repeated as required to form a desired layer structure of silicon nitride film laminate 80A In the process for producing the silicon nitride film laminate of the present invention, the plasma CVD is performed with conditions in which silicon-containing compound gas and ammonia gas are used as a film forming gas, the flow ratio of silicon-containing compound gas/ammonia gas is selected in the rage of 0.015 and 0.2, and the processing pressure is selected in the range of 0.1 Pa and 1333 Pa. As a result, the band gap of the silicon nitride film can be changed, for example, in the range of 2.5 eV~7 eV. The band gap of the formed silicon nitride film tends to be increased as the processing pressure is increased in the range of 0.1 Pa and 1333 Pa. Therefore, the band gap size of first silicon nitride film 70A, second silicon nitride film 71A, and third silicon nitride film 72A can be controlled in the range of 2.5 eV~7 eV by selecting the above first processing pressure, the second processing pressure and the third processing pressure in the range of 0.1 Pa and 1333 Pa.

For example, if the processing pressure is selected in the range of 0.1 Pa and 1333 Pa to satisfy a relationship where the first processing pressure>the second processing pressure>the third processing pressure, silicon nitride film laminate 80A can be formed having an energy band structure in which the band gap size satisfies a relationship where first silicon nitride film 70A>second silicon nitride film 71A>third silicon nitride film 72A. Also, on the contrary, if the processing pressure is selected in the range of 0.1 Pa and 1333 Pa so that the pressure condition satisfies a relationship where the first processing pressure<the second processing pressure<the third processing pressure, silicon nitride film laminate 80A can be formed having an energy band structure in which the band gap size satisfies a relationship where first silicon nitride film 70A<second silicon nitride film 71A<third silicon nitride film 72A. For example, if the first processing pressure and the third processing pressure are set to be equal, an energy band gap structure can be made in which the band gap size satisfies first silicon nitride film 70A=third silicon nitride film 72A.

Here, in order to deposit a silicon nitride film having the band gap size, for example, in the range of 2.5 eV and 5 eV, it is preferable to set the flow ratio (silicon-containing compound gas/ammonia gas flow ratio) of silicon-containing compound gas (e.g. $Si_2H_6$ gas) and ammonia gas in the range of 0.015 and 0.2, and set the processing pressure in the range of 0.1 Pa and 4 Pa. Also, the flow rate of Ar gas can be set in the range of 0~1000 mL/min (sccm), preferably in the range of 50~800 mL/min (sccm). The flow rate of $NH_3$ gas can be set in the range of 100~800 mL/min (sccm), preferably in the range of 100~400 mL/min (sccm). The flow rate of $Si_2H_6$ gas can be set in the range of 1~40 mL/min (sccm), preferably in the range of 3~20 mL/min (sccm). Each of these flow rates may be set such that the flow ratio condition is satisfied as indicated above.

Also, in order to deposit a silicon nitride film having the band gap size, for example, in the range of 5 eV and 7 eV, it is preferable to set the flow ratio (silicon-containing compound gas/ammonia gas flow ratio) of silicon-containing compound gas (e.g. $Si_2H_6$ gas) and ammonia gas in the range of 0.015 and 0.2, and set the processing pressure in the range of 8.9 Pa and 1333 Pa. Also, the flow rate of Ar gas can be set in the range of 0~1000 mL/min (sccm), and preferably in the range of 50~800 mL/min (sccm). The flow rate of $NH_3$ gas can be set in the range of 100~800 mL/min (sccm), preferably in the range of 100~400 mL/min (sccm). The flow rate of $Si_2H_6$ gas can be set in the range of 1~40 mL/min (sccm), preferably in the range of 3~20 mL/min (sccm). Each of these flow rates may be set such that the flow ratio condition is satisfied as indicated above.

Also, as for all of the above processing temperature of the plasma CVD process, the temperature of mount table 2 is set to be 300° C. or more, preferably in the range of 400° C. and 600° C.

Also, in the all of the above plasma CVD process, it is preferable to set the power density of microwave in the range of 0.256 W/cm$^2$ and 2.045 W/cm$^2$ per area of the transmission plate.

In the process of producing the silicon nitride film laminate of the present invention, silicon-containing compound gas and ammonia gas are used as a film forming gas, and the plasma CVD is performed by selecting the flow ratio of silicon-containing gas/nitrogen gas in the range of 0.015 and 0.2, and selecting the processing pressure in the range of 0.1 Pa and 1333 Pa. As a result, silicon nitride films each having different band gap can be alternately deposited on a wafer W thereby forming a silicon nitride film laminate. In particular, in the process of producing the silicon nitride film laminate of the present invention, the band gap can readily be controlled only by the processing pressure. Accordingly, a continuous film forming process can be performed in the same processing chamber with maintaining the vacuum state to form the silicon nitride film laminate having different band gaps. As a result, it is very advantageous to improve the process efficiency.

Also, because the band gap of the silicon nitride film can be easily adjusted only by adjusting the processing pressure, a silicon nitride film laminate of a variety of band gap structures can be easily manufactured. Therefore, when the present invention is applied to depositing the silicon nitride film laminate working as a charge-accumulating area of a MOS-type semiconductor memory device, the MOS-type semiconductor memory device can be produced to have a superior data storage, high-speed data re-writing, operability in low-power consumption, and a high reliability.

Application Example to Manufacturing Semiconductor Memory Device

Figure 14:
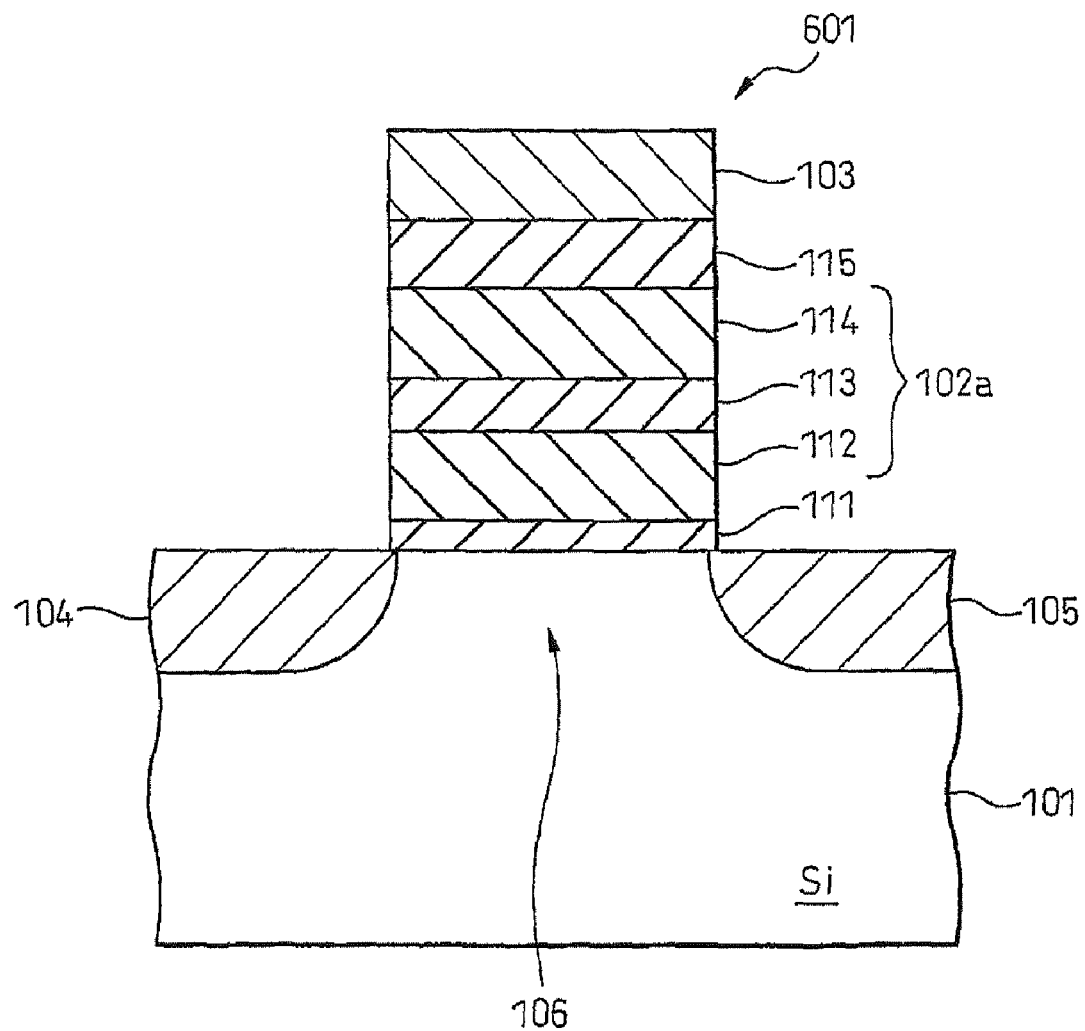
FIG. 14 is an explanatory view illustrating a schematic structure of a MOS type semiconductor memory device which is applicable to the process of the present invention.

Next, with reference to FIG. 14, descriptions will be made regarding the examples of applying the process for producing the silicon nitride film according to each of the above embodiments to a manufacturing process of semiconductor memory device. Hereinafter, examples are shown for silicon nitride films produced by the first~third embodiments. However, silicon nitride films may well be produced by the fourth or the fifth embodiments as well. FIG. 14 is a cross-sectional view illustrating the schematic structure of MOS-type semiconductor memory device 601. MOS-type semiconductor memory device 601 includes a p-type silicon substrate 101 as a semiconductor layer, a plurality of laminated insulating films formed on p-type silicon substrate 101 each having different band gap, and a gate electrode 103 thereon. Between silicon substrate 101 and gate electrode 103, a first insulating film 111, a second insulating film 112, a third insulating film 113, a fourth insulating film 114 and a fifth insulating film 115 are provided. Among them, second insulating film 112, third insulating film 113 and fourth insulating film 114 are all silicon nitride films, and form a silicon nitride film laminate 102a.

Also, a first source•drain 104 and a second source•drain 105 of n-type diffusion layers are formed are formed on silicon substrate 101 having a predetermined depth from the surface and to be located at both sides of gate electrode 103. And a channel-formed region 106 is provided between the two source•drain regions. MOS-type semiconductor memory device 601 may be formed in p-well or p-typed silicon layer provided in the semiconductor substrate. Also, although a n-channel MOS device is exemplified in the present embodiment, a p-channel MOS device may also be exemplified. Therefore, all of the contents of the present embodiment described hereinafter can be applied to both the n-channel MOS device and the p-channel MOS device.

A first insulating film 111 is, for example, a silicon dioxide film (SiO$_2$ film) deposited by oxidizing the surface of silicon substrate 101 with a thermal oxidization method. The band gap size of first insulating film 111 is, for example, in the range of 8~10 eV, and the film thickness is preferable to be, for example, in the range of 0.5 nm~20 nm, more preferably in the range of 1 nm~3 nm.

Second insulating film 112 forming silicon nitride film laminate 102a, is a silicon nitride film (SiN film; the composition ratio of Si and N is not necessarily determined stoichiometrically and can be different values according to film-forming conditions, and the same hereinafter) formed on the surface of first insulating film 111. The band gap size of second insulating film 112 is, for example, in the range of 5~7 eV, and the film thickness is preferably to be, for example, in the range of 2 nm~20 nm, more preferably in the range of 3 nm~5 nm.

Third insulating film 113 is a silicon nitride film (SiN film) formed on second insulating film 112. The band gap size of third insulating film 113 is, for example, in the range of 2.5~4 eV, and the film thickness is preferably to be, for example, in the range of 2 nm~30 nm, more preferably in the range of 4 nm~10 nm.

Fourth insulating film 114 is a silicon nitride film (SiN film) formed on third insulating film 113. Fourth insulating film 114 has, for example, the same energy band gap and the same film thickness as second insulating film 112.

Fifth insulating film 115 is a silicon dioxide film (SiO$_2$ film), for example, deposited by CVD method on fourth insulating film 114. Fifth insulating film 115 functions as a block layer (a barrier layer) between electrode 103 and fourth insulating film 114. The band gap size of fifth insulating film 115 is, for example, in the range of 8~10 eV, and the film thickness is preferably to be, for example, in the range of 2 nm~30 nm, more preferably in the range of 5 nm~8 nm.

Gate electrode 103 is formed with, for example, multi-crystal silicon film deposited with CVD method, and functions as a control gate (CG) electrode. Also, gate electrode 103 may be, for example, a film including metal such as W, Ti, Ta, Cu, Al, Au and Pt. Gate electrode 103 is not limited to a single-layer, and may be a laminated structure including, for example, tungsten, molybdenum, tantalum, titanium, platinum, silicide of the above, nitride, alloy and so on, for the purpose of decreasing the specific resistance of gate electrode 103 and improving the operation speed of MOS-type semiconductor memory device 601. Gate electrode 103 is connected with a wiring layer not illustrated.

Also, in MOS-type semiconductor memory device 601, silicon nitride film laminate 102a formed with second insulating film 112, third insulating film 113 and fourth insulating film 114, is mainly a charge-accumulating area which accumulates charges. Therefore, when second insulating film 112, third insulating film 113 and fourth insulating film 114 are formed, the process for producing the silicon nitride film of the first embodiment of the present invention may be applied to control the band gap size of each layer. As a result, the data-writing performance and data-storage performance of MOS-type semiconductor memory device 601 can be adjusted. Also, by applying the producing method of the silicon nitride film laminate of the second embodiment of the present invention, second insulating film 112, third insulating film 113 and fourth insulating film 114 can be produced continuously in the same treatment vessel, by setting the processing pressure constant in plasma CVD apparatus 100 and changing the flow ratio of silicon-containing compound gas/nitrogen gas. Also, by applying the producing method of the silicon nitride film laminate of the third embodiment of the present invention, second insulating film 112, third insulating film 113 and fourth insulating film 114 can be produced continuously in the same treatment vessel so that they have different band gaps from each other, by changing the size of the RF bias for wafer W in plasma CVD apparatus 200.

Here, as an example of representative procedures, descriptions will be made for an application example where the method of the present invention is applied to producing MOS type semiconductor memory device 601. At first, silicon substrate 101 is provided formed with an element-separating film (not illustrated) by methods such as LOCOS (Local Oxidation of Silicon) method or STI (Shallow Trench Isolation) method, and first insulating film 111 is formed on the surface of the element-separating film by, for example, a thermal oxidization method.

Next, second insulating film 112, third insulating film 113 and fourth insulating film 114 are formed sequentially on first insulating film 111 by plasma CVD method using either plasma CVD apparatus 100 or plasma process apparatus 200.

When second insulating film 112 is formed, plasma CVD conditions are adjusted so that the band gap has an arbitrary value, for example, in the range of 5~7 eV. When third insulating film 113 is formed, plasma CVD is performed with different conditions from those of second insulating film 112, and plasma CVD conditions are adjusted so that the band gap is, for example, in the range of 2.5 eV~4 eV. When fourth insulating film 114 is formed, plasma CVD is performed on different pressure conditions from those of third insulating film 113, for example, with the same pressure conditions as those of second insulating film 11,2 and plasma CVD conditions are adjusted so that the band gap size is, for example, in the range of 5 eV~7 eV. As described above, the band gap size of each film can be controlled by keeping the processing pressure of plasma CVD process constant and changing the flow ratio of silicon-containing compound gas and nitrogen gas.

Next, fifth insulating film 115 is formed on fourth insulating film 114. Fifth insulating film 115 can be formed, for example, by CVD method. Also, a metal film of gate electrode 103 is formed on fifth insulating film 115 by depositing polysilicon layer, metal layer, or metal silicide layer, etc, for example, with CVD method.

Next, the metal film and fifth insulating layer 115~first insulating layer 111 are etched with a photolithography technology using the patterned resist as a mask thereby obtaining pattern formed gate electrode 103 and a laminated gate structure having a plurality of insulating layers. Next, first source•drain 104 and second source•drain 105 are formed by injecting n-type impurities with high concentration on the surface of silicon adjacent at both sides of the laminated gate structure. In this way, MOS-type semiconductor memory device 601 illustrated in FIG. 14 can be produced.

In the above examples of silicon nitride film laminate 102a, the band gap of each of second insulating film 112 and fourth insulating film 114 is larger than that of third insulating film 113. However, the band gap of third insulating film 113 may be larger than those of second insulating film 112 and fourth insulating film 114. Also, the band gap sizes of second insulating film 112 and fourth insulating film 114 are not necessarily the same.

Also, in FIG. 14, silicon nitride film laminate 102a having three layers of second insulating film 112~fourth insulating film 114 is exemplified. However, the method of the present invention can be also applied to manufacturing of MOS-type semiconductor memory device having a silicon nitride film laminate with two-layered, four-layered or more than four-layered of laminated structure.

In the above, the embodiments of the present invention are described. However, the present invention is not limited to the above embodiments and can be modified to various embodiments. For example, in the above embodiments, nitrogen gas, ammonia gas or disilane is exemplified as a film-forming raw gas. However, the Si/N ratio and the band gap size of silicon nitride film can be controlled by changing the flow ratio of silicon-containing compound gas/nitrogen gas or ammonia, even if different silicon-containing compound gas such as silane, trisilane or trisilylamine is used.

What is claimed is:

1. A process for producing a silicon nitride film that introduces microwaves into a treatment vessel via a planar antenna having a plurality of holes to generate plasma using a plasma CVD apparatus and forms the silicon nitride film on an object to be treated by a plasma CVD method, the process comprising:
setting a treatment pressure to be constant in a range from 0.1 Pa to 1333 Pa using a film forming gas including a silicon-containing compound gas and either one of nitrogen gas and ammonia gas;
when the film forming gas includes nitrogen gas, selecting at least two flow ratios of the silicon-containing compound gas to nitrogen gas (silicon-containing compound gas/nitrogen gas) in the range of 0.005 and 0.2 while keeping the treatment pressure constant;
when the film forming gas includes ammonia gas, selecting at least two flow ratios of the silicon-containing compound gas to ammonia gas (silicon-containing compound gas/ammonia gas) in the range of 0.015 and 0.2 while keeping the treatment pressure constant; and
forming the silicon nitride film having at least two regions each having a band gap in the range of 2.5 eV and 7 eV by performing the plasma CVD method,
wherein the band gap of the silicon nitride film in each of the at least two regions is different from each other by at least 0.3 eV.

2. The process of claim 1, wherein the treatment pressure is in the range of 0.1 Pa and 4 Pa or is in the range of 40 Pa and 1333 Pa.

3. The process of claim 1, further comprising supplying a high-frequency wave to the object to be treated with a power density of 0.01 W/cm$^2$ and 0.64 W/cm$^2$.

4. A process for producing a silicon nitride film laminate that introduces microwaves into a treatment vessel via a planar antenna having a plurality of holes to generate plasma using a plasma CVD apparatus and forms the silicon nitride film laminate on an object, the process comprising:
a first CVD process comprising:
setting a treatment pressure to be constant in a range from 0.1 Pa to 1333 Pa using a film forming gas including a silicon-containing gas and either nitrogen gas or ammonia gas;
when the film forming gas includes nitrogen gas, selecting a flow ratio of the silicon-containing compound gas to nitrogen gas in the range of 0.005 and 0.2 while keeping the treatment pressure constant;
when the film forming gas includes ammonia gas, selecting a flow ratio of silicon-containing compound gas to ammonia gas in the range of 0.015 and 0.2 while keeping the treatment pressure constant; and
forming a first silicon nitride film having a first band gap in the range of 2.5 eV and 7 eV by performing a plasma CVD process; and
a second CVD process performed either prior to or after the first CVD process, comprising:
setting the treatment pressure with the same pressure as in the first CVD process using a second film forming gas including a silicon-containing compound gas and either one of the nitrogen gas and the ammonia gas;
when the film forming gas includes nitrogen gas, selecting the flow ratio of the silicon-containing compound gas to nitrogen gas (silicon-containing compound gas/nitrogen gas) different from the flow ratio of the first CVD process in the range of 0.005 and 0.2 while keeping the treatment pressure constant;
when the second film forming gas includes ammonia gas, selecting the flow ratio of the silicon-containing compound gas to ammonia gas (silicon-containing compound gas/ammonia gas) different from the flow rate of the first CVD process in the range of 0.015 and 0.2 while keeping the treatment pressure constant; and
forming a second silicon nitride film having a second band gap different from the first band gap in the range of 2.5 eV and 7 eV,
wherein the first band gap is different from the second band gap by at least 0.3 eV.

5. The process of claim 4, further comprising repeating the first and second CVD processes.

6. A non-transitory computer-readable recording medium storing a computer executable program that, when executed, causes a computer to perform a process for producing a silicon nitride film that introduces microwaves into a treatment vessel via a planar antenna having a plurality of holes to generate plasma using a plasma CVD apparatus and forms the silicon nitride film on an object to be treated by a plasma CVD method, the process comprising:
setting a treatment pressure to be constant in a range from 0.1 Pa to 1333 Pa using a film forming gas including a silicon-containing compound gas and either one of nitrogen gas or ammonia gas;
when the film forming gas includes nitrogen gas, selecting a flow ratio of the silicon-containing compound gas to nitrogen gas (silicon-containing compound gas/nitrogen gas) in the range of 0.005 and 0.2 while keeping the treatment pressure constant;
when the film forming gas includes ammonia gas, selecting a flow ratio of the silicon-containing compound gas to ammonia gas (silicon-containing compound gas/ammonia gas) in the range of 0.015 and 0.2 while keeping the treatment pressure constant; and
forming the silicon nitride film having at least two regions each having a band gap in the range of 2.5 eV and 7 eV by performing the plasma CVD method,
wherein the band gap of the silicon nitride film in each of the at least two regions is different from each other by at least 0.3 eV.

7. A plasma CVD apparatus that forms a silicon nitride film on an object to be treated by a plasma CVD method, comprising:
a treatment vessel configured to place and accommodate the object to be treated on a mount table;
a dielectric member configured to cover the an opening of the treatment vessel;
a planar antenna disposed at an outside of the dielectric member having a plurality of holes to introduce microwaves into the treatment vessel;

a gas supply device configured to supply source gas into the treatment vessel; an exhaust system configured to depressurize the treatment vessel; and a control unit configured to control the plasma CVD method to form the silicon nitride film in the treatment vessel, wherein the control unit sets a treatment pressure to be constant in a range from 0.1 Pa to 1333 Pa using a film forming gas including a silicon-containing compound gas and either one of nitrogen gas or ammonia gas;

when the film forming gas includes nitrogen gas, selects a flow ratio of the silicon-containing compound gas to nitrogen gas (silicon-containing compound gas/nitrogen gas) in the range of 0.005 and 0.2 while keeping the treatment pressure constant;

when the film forming gas includes ammonia gas, selects a flow ratio of the silicon-containing compound gas to ammonia gas (silicon-containing compound gas/ammonia gas) in the range of 0.015 and 0.2 while keeping the treatment pressure constant; and forms the silicon nitride film having at least two regions each having a band gap in the range of 2.5 eV and 7 eV, wherein the band gap of the silicon nitride film in each of the at least two regions is different from each other by at least 0.3 eV.

* * * * *